US009781824B2

(12) United States Patent
Kagaya et al.

(10) Patent No.: US 9,781,824 B2
(45) Date of Patent: Oct. 3, 2017

(54) DIFFERENTIAL TRANSMISSION CIRCUIT, OPTICAL MODULE AND MANUFACTURING METHOD OF DIFFERENTIAL TRANSMISSION CIRCUIT

(71) Applicant: Oclaro Japan, Inc., Kanagawa (JP)

(72) Inventors: Osamu Kagaya, Tokyo (JP); Koyu Takahashi, Kanagawa (JP)

(73) Assignee: OCLARO JAPAN, INC., Kanagawa (JP)

( * ) Notice: Subject to any disclaimer, the term of this patent is extended or adjusted under 35 U.S.C. 154(b) by 32 days.

(21) Appl. No.: 14/674,414

(22) Filed: Mar. 31, 2015

(65) Prior Publication Data

US 2015/0282300 A1     Oct. 1, 2015

(30) Foreign Application Priority Data

Apr. 1, 2014  (JP) .................. 2014-075627

(51) Int. Cl.
| | |
|---|---|
| H05K 1/02 | (2006.01) |
| H05K 3/46 | (2006.01) |
| H05K 3/10 | (2006.01) |
| H01P 3/02 | (2006.01) |
| H04B 10/40 | (2013.01) |
| G02B 6/42 | (2006.01) |

(52) U.S. Cl.
CPC ......... *H05K 1/0245* (2013.01); *G02B 6/4201* (2013.01); *H05K 1/0298* (2013.01); *H05K 2201/10121* (2013.01)

(58) Field of Classification Search
CPC .................................. H05K 1/0245
USPC .......................................... 333/5
See application file for complete search history.

(56) References Cited

U.S. PATENT DOCUMENTS

| | | | | |
|---|---|---|---|---|
| 6,041,224 | A | * | 3/2000 | Wada .................... H01P 1/2039 333/204 |
| 7,609,125 | B2 | | 10/2009 | van Quach et al. |
| 8,212,149 | B2 | | 7/2012 | Karikalan et al. |
| 8,336,203 | B2 | | 12/2012 | Lin |
| 8,344,821 | B2 | | 1/2013 | Lin |

(Continued)

FOREIGN PATENT DOCUMENTS

| | | |
|---|---|---|
| CN | 101795530 A | 8/2010 |
| CN | 102333413 A | 1/2012 |

(Continued)

OTHER PUBLICATIONS

Chinese Office Action received in corresponding Chinese Application No. 201510150562.9 dated Jun. 13, 2017.

*Primary Examiner* — Stephen E Jones
*Assistant Examiner* — Scott S Outten
(74) *Attorney, Agent, or Firm* — Mattingly & Malur, PC

(57) ABSTRACT

A differential transmission circuit includes: a dielectric layer for embedding a plurality of first strip conductor pairs arranged side by side in the same layer above a ground conductor layer, each of the plurality of first strip conductor pairs including a first right strip conductor and a first left strip conductor, the dielectric layer being formed from an upper side of the ground conductor layer up to a region above the plurality of first strip conductor pairs, the dielectric layer having a flat upper surface. A region between adjacent two of the plurality of first strip conductor pairs is embedded in the dielectric layer without arranging a conductor in the region.

12 Claims, 25 Drawing Sheets

(56) References Cited

U.S. PATENT DOCUMENTS

| | | | |
|---|---|---|---|
| 2002/0017963 A1* | 2/2002 | Shimamoto | H01P 3/08 333/1 |
| 2005/0077977 A1* | 4/2005 | Beale | H01P 3/02 333/5 |
| 2007/0040626 A1* | 2/2007 | Blair | H01P 3/006 333/1 |
| 2010/0102903 A1* | 4/2010 | Velayudham Karikalan | H05K 1/0219 333/238 |
| 2010/0200276 A1* | 8/2010 | Karikalan | H05K 1/0245 174/250 |
| 2012/0007688 A1* | 1/2012 | Zhou | H05K 1/0245 333/4 |
| 2012/0295453 A1* | 11/2012 | Cipolla | H01R 12/716 439/67 |
| 2012/0318563 A1* | 12/2012 | Ookawa | H05K 1/0245 174/250 |
| 2013/0112464 A1 | 5/2013 | Karikalan | |

FOREIGN PATENT DOCUMENTS

| | | |
|---|---|---|
| CN | 102833940 A | 12/2012 |
| JP | 2004-304134 A | 10/2004 |

* cited by examiner

PRIOR ART

PRIOR ART

DIFFERENTIAL TRANSMISSION CIRCUIT, OPTICAL MODULE AND MANUFACTURING METHOD OF DIFFERENTIAL TRANSMISSION CIRCUIT

CROSS-REFERENCE TO RELATED APPLICATION

The present application claims priority from Japanese application JP 2014-075627 filed on Apr. 1, 2014, the content of which is hereby incorporated by reference into this application.

BACKGROUND OF THE INVENTION

1. Field of the Invention

The present invention relates to a differential transmission circuit, an optical module, and a method of manufacturing a differential transmission circuit.

2. Description of the Related Art

For example, optical modules (optical transceiver modules) for optical fiber transmission have been increased in speed and reduced in size and cost along with the widespread use of broadband networks in recent years. In general, a differential transmission is used for high-speed digital signal transmission. Thus, on one surface of a printed circuit board of the optical module, a plurality of channels are formed of differential transmission lines (balanced transmission lines) for high-speed digital signals.

On the other hand, when the plurality of differential transmission lines are arranged close to each other on the printed circuit board, there is a fear of an influence due to forward crosstalk between the transmission lines. The forward crosstalk refers to crosstalk generated on the far end, which is opposite to a signal source, when two pairs of differential transmission lines for propagation in the same direction have a region where the differential transmission lines are arranged close and parallel to each other. The crosstalk amount of the transmission line is known to increase as the length of this region increases and as the signal bit rate increases. As described above, in the optical module that is increasingly downsized and is required to have a plurality of differential transmission lines arranged thereon, a technology for suppressing the crosstalk amount to the minimum is important. Hitherto, as a method of reducing the crosstalk amount between the differential transmission lines, in U.S. Pat. No. 7,609,125, there is disclosed a technology using metal wiring that is connected to ground wiring and arranged between and parallel to the plurality of differential transmission lines formed of strip conductor pairs, to thereby obtain an effect of reducing the crosstalk amount.

SUMMARY OF THE INVENTION

In recent years, there are demands for further downsizing of a device. As the device is downsized, the crosstalk of the plurality of differential transmission lines included in the device becomes a more serious problem. For example, in the optical modules (optical transceiver modules) for optical fiber transmission, along with the widespread use of the broadband networks in recent years and also with increase in speed and reduction in size and cost, the standard of the optical module is expected to advance from current CFP to CFP2 and CFP4 (which are each based on the MSA standard). Along with the change of the standard, the case volume and the number of components may be further reduced.

FIG. 1 is a view illustrating an example of outer shapes of optical modules based on the MSA standard. As illustrated in FIG. 1, the case volume is reduced in the order of CFP, CFP2, and CFP4. Further, as the optical module is downsized, the width and area of the printed circuit board are accordingly further reduced, which causes increase in packaging densities of wiring and components mounted on the printed circuit board. In view of this, first, the inventors of the present invention have studied a wiring layout of the printed circuit board included in the optical module based on the CFP4 MSA standard as a related art of the present invention. With reference to the wiring layout of the printed circuit board according to the related art of the present invention, problems relating to the crosstalk of the differential transmission lines are described below.

FIG. 2 is a view illustrating the wiring layout of a printed circuit board 20 according to the related art of the present invention. The wiring layout of the printed circuit board illustrated in FIG. 2 represents an example of the wiring layout of the printed circuit board 20 included in the optical module based on the CFP4 MSA standard, which has been studied by the inventors of the present invention. In the CFP4 MSA standard, the following is defined. The width of the printed circuit board 20 is about 18 mm to 19 mm, and terminals 30 for connector connection are arranged at one end of the printed circuit board. Further, a terminal distance P0, which is a distance between centers of the adjacent terminals 30, is 0.6 mm, and the terminals are arranged in the order of GSSGSSG . . . (G: ground terminal, S: signal terminal). Further, as the differential transmission lines for high-speed digital signals with a bit rate as much as 100 Gbit/s, a four-channel receiver-side differential transmission line 2 at the receiver side and a four-channel transmitter-side differential transmission line 3 at the transmitter side are all required to be arranged on one surface of the printed circuit board 20 described above. Note that, the bit rate of an electrical signal to be transmitted through each channel is 25.78125 Gbit/s in the case of a system complying with IEEE 802.3ba, and is 27.95249339 Gbit/s in the case of a system complying with ITU-T G.959.1 supporting the OTN (optical channel transport unit 4).

As illustrated in FIG. 2, the receiver-side differential transmission line 2 and the transmitter-side differential transmission line 3, which are connected to the terminals 30 arranged at the one end of the printed circuit board 20, are extended while maintaining a constant channel pitch Pa (Pa=1.8 mm), and are connected to a receiving integrated circuit 106 and a transmitting integrated circuit 107, respectively. Further, metal wiring 40 for reducing crosstalk is arranged between the channels of each differential transmission line. The metal wiring 40 is connected to a ground conductor layer (not shown) inside the board through via holes. As described above, in the wiring layout illustrated in FIG. 2, a region at one end of the printed circuit board 20 (region between the terminals 30 and the receiving integrated circuit 106 and region between the terminals 30 and the transmitting integrated circuit 107) is substantially occupied by only wiring, and it is extremely difficult to arrange other mounting components or form a through via hole for connection to inner layer wiring.

Further, in the printed circuit board illustrated in FIG. 2, arrangement and formation of the metal wiring 40 and the through via holes may be omitted, and the channel pitch Pa may be set narrower than 1.8 mm, to thereby reduce the region occupied by the receiver-side differential transmission line 2 and the transmitter-side differential transmission line 3. However, narrowing the channel pitch Pa causes a problem of increase in crosstalk between the differential transmission lines.

In view of this, the inventors of the present invention further studied the wiring layout of the printed circuit board 20 according to the related art of the present invention as follows.

As illustrated in FIG. 2, in the printed circuit board 20 included in the optical transceiver based on the CFP4 MSA standard, the metal wiring 40 can be arranged parallel to each differential transmission line and between the channels of each of the receiver-side differential transmission line 2 and the transmitter-side differential transmission line 3.

FIG. 3 is a graph showing crosstalk characteristics between the channels of the differential transmission line arranged in the printed circuit board 20 according to the related art. FIG. 3 shows calculation results of the crosstalk characteristics calculated by the inventors of the present invention in the printed circuit board 20 illustrated in FIG. 2. In this case, the crosstalk characteristics are calculated assuming that a channel length L is 14 mm and the channel pitch Pa of the differential transmission line is 1.8 mm. Note that, the crosstalk characteristics are calculated with use of a 3D electromagnetic field analysis tool. As shown in FIG. 3, in a frequency range of from 0 Hz to 30 GHz, the crosstalk amount is −42 dB or less, which is a satisfactory value. However, although it is possible to set the channel pitch Pa to 1.8 mm (three times as large as P0) based on the terminal distance of the terminals 30 (0.6 mm) as illustrated in FIG. 2, it is difficult to set the channel pitch Pa narrower than 1.8 mm because the metal wiring 40 and the via holes are required to be arranged and formed. Thus, it is difficult to secure a region for mounting other components.

The present invention has been made in view of the above-mentioned circumstances, and it is an object of the present invention to provide a differential transmission circuit including a plurality of transmission lines, and an optical module capable of, in the optical module having a plurality of differential transmission lines arranged thereon, reducing the crosstalk amount between the differential transmission lines, narrowing the region occupied by the differential transmission line, and increasing the speed and packaging density.

(1) In order to solve the above-mentioned problem, according to one embodiment of the present invention, there is provided a differential transmission circuit, including: a ground conductor layer; a plurality of first strip conductor pairs arranged side by side in the same layer above the ground conductor layer, each of the plurality of first strip conductor pairs including a first right strip conductor and a first left strip conductor; and a dielectric layer for embedding the plurality of first strip conductor pairs from an upper side of the ground conductor layer, the dielectric layer being formed up to a region above the plurality of first strip conductor pairs, the dielectric layer having a flat upper surface, in which a region between adjacent two of the plurality of first strip conductor pairs is embedded in the dielectric layer without arranging a conductor in the region.

(2) In the differential transmission circuit according to Item (1), the each of the plurality of first strip conductor pairs has a length of 14 mm or less, a distance between inner edges of the first right strip conductor and the first left strip conductor in the each of the plurality of first strip conductor pairs is 0.25 mm or less, and when an x coordinate represents a distance from the ground conductor layer to the plurality of first strip conductor pairs and a y coordinate represents a distance between centers of the adjacent two of the plurality of first strip conductor pairs, the distance from the ground conductor layer to the plurality of first strip conductor pairs and the distance between the centers of the adjacent two of the plurality of first strip conductor pairs represent a combination positioned one of on and inside a range of a rectangle having vertices of (0.1 mm, 1.0 mm), (0.1 mm, 0.8 mm), (0.5 mm, 1.4 mm), and (0.5 mm, 2.1 mm).

(3) In the differential transmission circuit according to Item (1), the dielectric layer is made of a glass epoxy resin.

(4) In the differential transmission circuit according to Item (1), the dielectric layer is made of a glass epoxy resin from the ground conductor layer up to upper surfaces of the plurality of first strip conductor pairs, and is made of a solder resist from the upper surfaces of the plurality of first strip conductor pairs to an interface with an outer gas.

(5) In the differential transmission circuit according to Item (1), the plurality of first strip conductor pairs have the same signal transmission direction.

(6) In order to solve the above-mentioned problem, according to one embodiment of the present invention, there is provided an optical module, including the differential transmission circuit according to Item (1).

(7) The optical module according to Item (6) further includes a plurality of first signal terminal pairs and a plurality of first ground terminals repeatedly arranged side by side in a terminal layer above the ground conductor layer at one end of the plurality of first strip conductor pairs. Each of the plurality of first signal terminal pairs is electrically connected to corresponding one of the plurality of first strip conductor pairs. Each of the plurality of first ground terminals is electrically connected to the ground conductor layer. A distance between centers of the adjacent two of the plurality of first strip conductor pairs is smaller than a distance between centers of corresponding adjacent two of the plurality of first signal terminal pairs.

(8) The optical module according to Item (7) further includes: a plurality of second strip conductor pairs arranged in the same layer as the plurality of first strip conductor pairs further at one side of the plurality of first strip conductor pairs; and a plurality of second signal terminal pairs and a plurality of second ground terminals repeatedly arranged side by side in the terminal layer further at the one side of the plurality of first signal terminal pairs and the plurality of first ground terminals. Each of the plurality of second strip conductor pairs includes a second right strip conductor and a second left strip conductor. A region between adjacent two of the plurality of second strip conductor pairs is embedded in the dielectric layer without arranging a conductor in the region. Each of the plurality of second signal terminal pairs is electrically connected to corresponding one of the plurality of second strip conductor pairs. Each of the plurality of second ground terminals is electrically connected to the ground conductor layer. A distance between centers of the adjacent two of the plurality of second strip conductor pairs is smaller than a distance between centers of corresponding adjacent two of the plurality of second signal terminal pairs. One of the each of the plurality of first strip conductor pairs and the each of the plurality of second strip conductor pairs is used for transmitting, and another thereof is used for receiving.

(9) In the optical module according to Item (8), the centers of the plurality of second strip conductor pairs are arranged at the one side with respect to the centers of the plurality of second signal terminal pairs, and the centers of the plurality of first strip conductor pairs are arranged at another side opposite to the one side with respect to the centers of the plurality of first signal terminal pairs.

(10) The optical module according to Item (8) further includes metal wiring positioned between the plurality of first strip conductor pairs and the plurality of second strip conductor pairs and arranged in the same layer as the plurality of first strip conductor pairs and the plurality of second strip conductor pairs, the metal wiring being electrically connected to the ground conductor layer.

(11) In the optical module according to Item (10), the centers of the plurality of first strip conductor pairs are arranged at the one side with respect to the centers of the plurality of first signal terminal pairs, and are arranged at the another side opposite to the one side of the metal wiring, and the centers of the plurality of second strip conductor pairs are arranged at the another side with respect to the centers of the plurality of second signal terminal pairs, and arranged at the one side of the metal wiring.

(12) According to one embodiment of the present invention, there is provided a method of manufacturing a differential transmission circuit, including: forming a differential transmission line basic structure, including: forming a ground conductor layer on a printed circuit board; forming a first dielectric layer of a first glass epoxy resin in a cured state on the ground conductor layer; and forming a plurality of strip conductor pairs each including a right strip conductor and a left strip conductor so as to be arranged side by side on the first dielectric layer; forming a prepreg dielectric in a semi-cured state; forming a second dielectric layer by bonding the prepreg dielectric and metal foil on upper and lower surfaces of the differential transmission line basic structure and by heating in a pressurized state with use of a planar heating platen; and removing the metal foil.

(13) According to one embodiment of the present invention, there is provided a method of manufacturing a differential transmission circuit, including: forming a differential transmission line basic structure, including: forming a ground conductor layer on a printed circuit board; forming a first dielectric layer of a first glass epoxy resin in a cured state on the ground conductor layer; and forming a plurality of strip conductor pairs each including a right strip conductor and a left strip conductor so as to be arranged side by side on the first dielectric layer; forming a prepreg dielectric in a semi-cured state; forming a second dielectric layer by bonding the prepreg dielectric and metal foil on upper and lower surfaces of the differential transmission line basic structure and by heating in a pressurized state with use of a planar heating platen; removing the metal foil; forming a third dielectric layer having an upper surface that is flush with upper surfaces of the plurality of strip conductor pairs by polishing the second dielectric layer; and forming a solder resist layer by applying a solder resist on the third dielectric layer and the plurality of strip conductor pairs.

According to one embodiment of the present invention, the differential transmission circuit including the plurality of transmission lines and the optical module are provided, which are capable of, in the optical module having the plurality of differential transmission lines arranged thereon, reducing the crosstalk amount between the differential transmission lines, narrowing the region occupied by the differential transmission line, and increasing the speed and packaging density.

DETAILED DESCRIPTION OF THE INVENTION

First Embodiment

Figure 1:
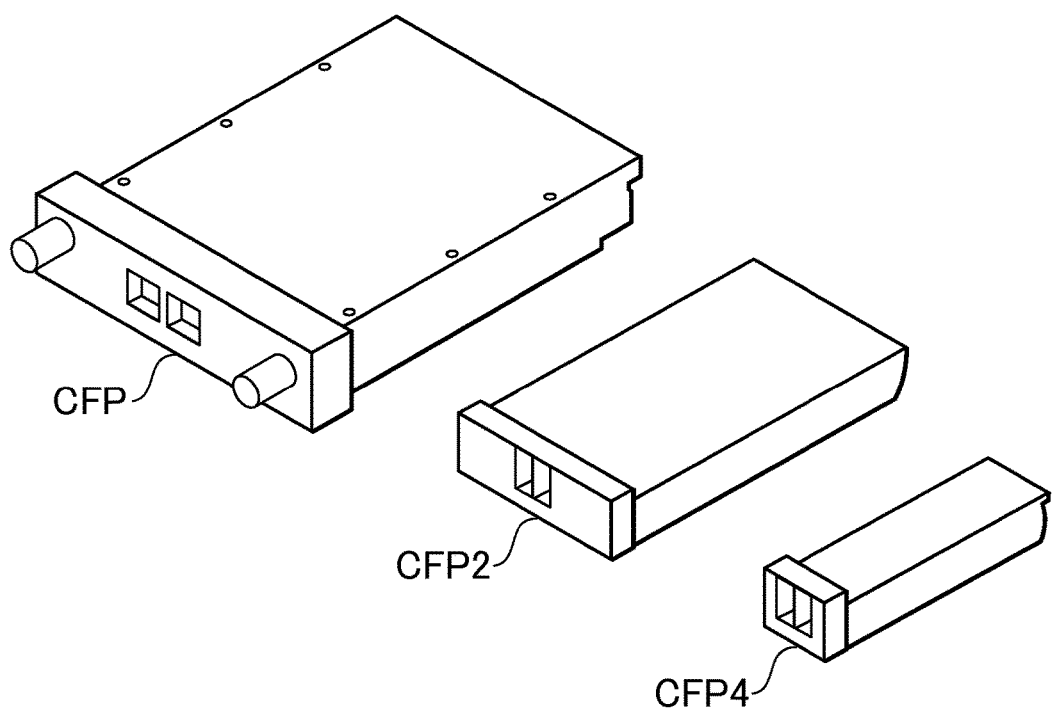
FIG. 1 is a view illustrating an example of outer shapes of optical modules based on the MSA standard.
Figure 2:
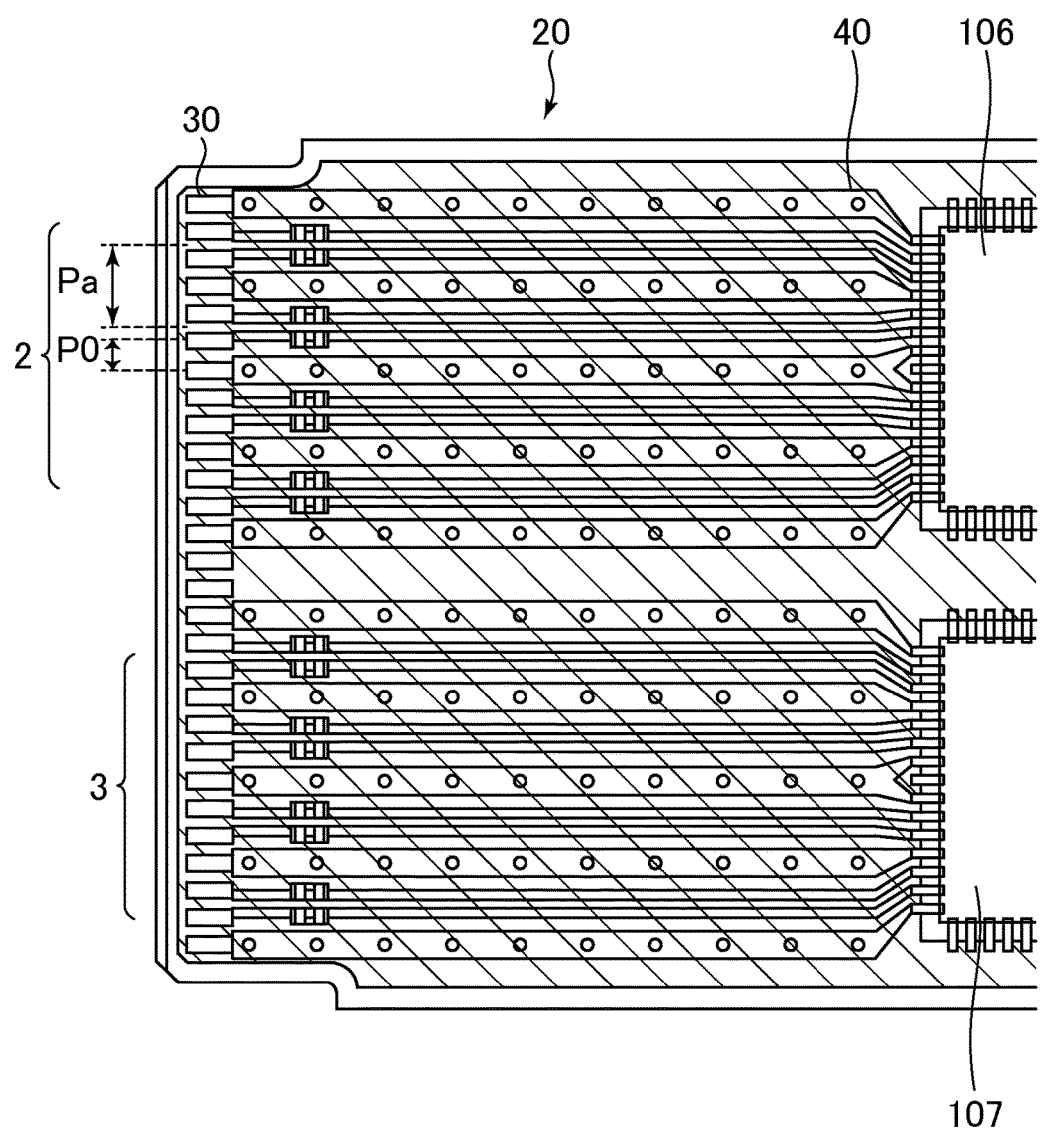
FIG. 2 is a view illustrating a wiring layout of a printed circuit board according to a related art of the present invention.
Figure 3:
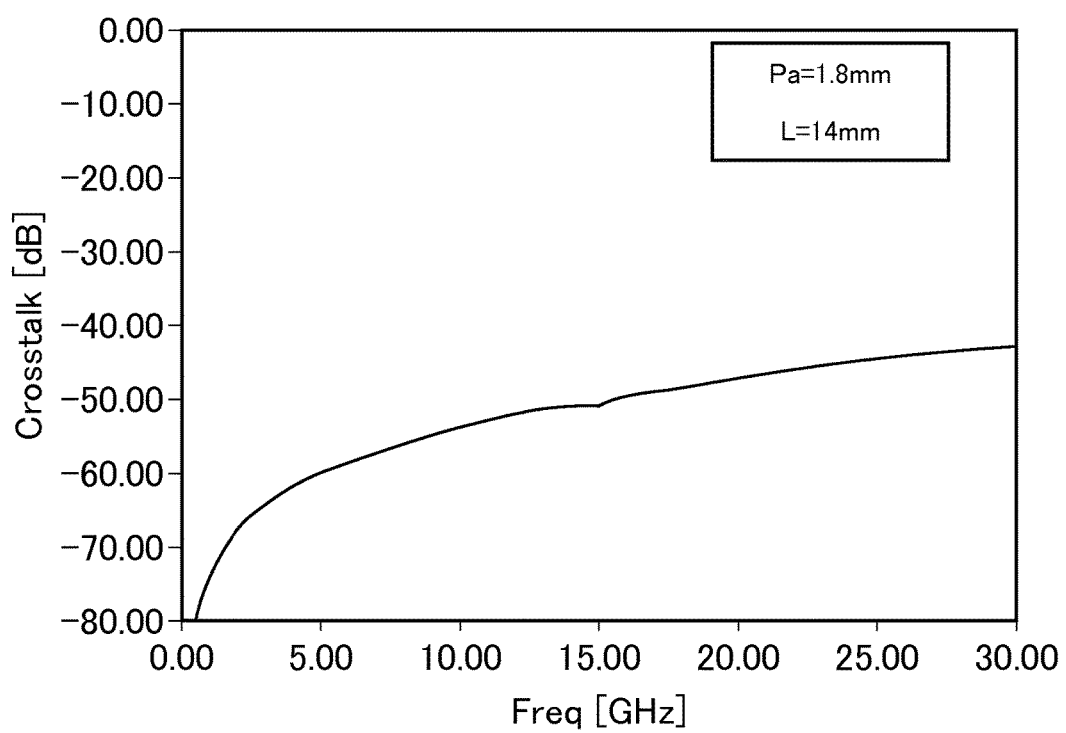
FIG. 3 is a graph showing crosstalk characteristics between channels of a differential transmission line arranged in the printed circuit board according to the related art of the present invention.

Referring to the accompanying drawings, a first embodiment of the present invention is described below. In the drawings, the same or similar components are denoted by the same reference symbols, and repetitive description thereof is omitted. Note, in this specification, a transmission circuit may include one or a plurality of transmission lines. Further, one transmission line may be a transmission line having one or more channels.

Figure 4:
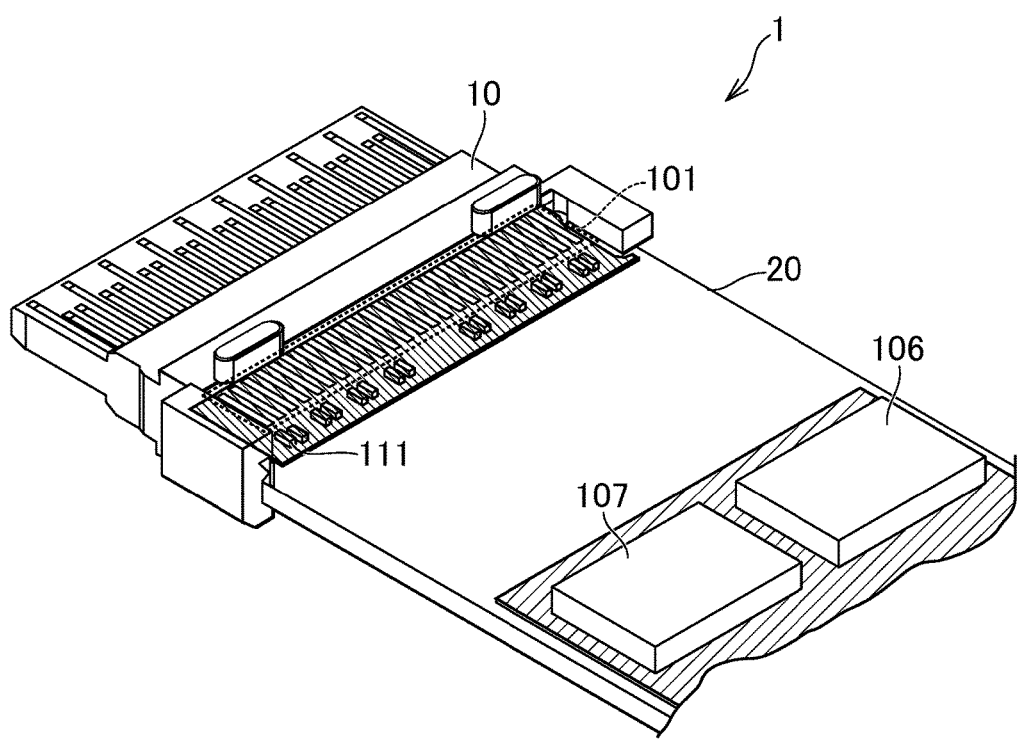
FIG. 4 is a schematic view of an optical module according to a first embodiment of the present invention.

FIG. 4 is a schematic view of an optical module 1 (optical transmission device) according to this embodiment. As illustrated in FIG. 4, the optical module 1 according to this embodiment includes a connector 10 and a printed circuit board 20.

The connector 10 is, for example, a plug connector, a second connector, or the like, and is configured to physically and electrically connect the optical module 1 to a network device (not shown).

The printed circuit board 20 is a multi-layer printed wiring board, such as a ten-layer printed wiring board formed by a build-up method. The printed circuit board 20 includes a terminal row 101, DC cut capacitors 111, a receiving integrated circuit 106, and a transmitting integrated circuit 107.

The terminal row 101 includes terminals for connector connection, and is connected to the connector 10. In this embodiment, the terminal row 101 includes a receiver-side terminal row 91 and a transmitter-side terminal row 92 to be described below. The receiver-side terminal row 91 is arranged at one side with respect to the center of the printed circuit board 20, and the transmitter-side terminal row 92 is arranged at another side with respect thereto. Then, between the receiver-side terminal row 91 and the receiving integrated circuit 106 and between the transmitter-side terminal row 92 and the transmitting integrated circuit 107, differential transmission lines (not shown) are arranged together with the DC cut capacitors 111. Note that, the terminal row 101 may include only one of the receiver-side terminal row 91 and the transmitter-side terminal row 92. Note that, the DC cut capacitor 111 may be omitted.

The receiving integrated circuit 106 is, for example, a receiving clock data recovery (CDR) integrated circuit, and is configured to output high-speed serial data to the network device via the differential transmission line and the connector 10. The transmitting integrated circuit 107 is, for example, a transmitting CDR integrated circuit, and is configured to input high-speed serial data from the network device via the differential transmission line and the connector 10.

Figure 5A:
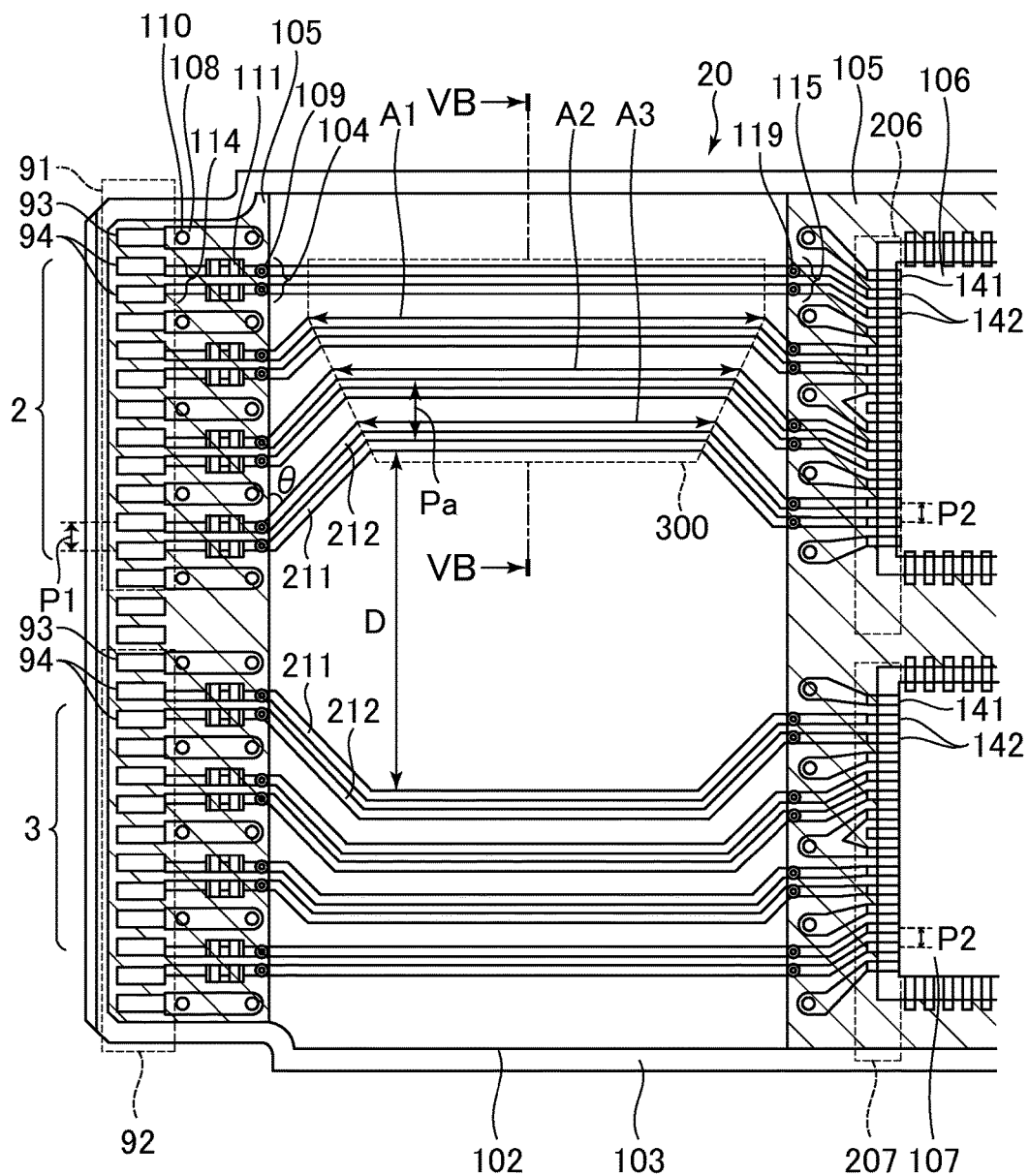
FIG. 5A is a top view of a printed circuit board according to the first embodiment of the present invention.

FIG. 5A is a top view of the printed circuit board 20 according to this embodiment. As illustrated in FIG. 5A, the four-channel receiver-side differential transmission line 2 at the receiver side is arranged between the receiver-side terminal row 91 and the receiving integrated circuit 106, and the four-channel transmitter-side differential transmission line 3 at the transmitter side is arranged between the transmitter-side terminal row 92 and the transmitting integrated circuit 107.

The optical module 1 of this embodiment is based on the CFP4 MSA standard. The dimensions of the printed circuit board 20 are defined based on the CFP4 MSA standard. Specifically, in the CFP4 MSA standard, the width of the printed circuit board 20 is defined to be 17.85 mm in a region of the receiver-side terminal row 91 and the transmitter-side terminal row 92, and to be 19 mm in the widest part. The thickness of the printed circuit board 20 is set to, for example, 1 mm. As illustrated in FIG. 5A, in each of the receiver-side terminal row 91 and the transmitter-side terminal row 92 that are arranged at one end (left side in FIG. 5A) of a plurality of strip conductor pairs 104 (124), a ground terminal 93 (first ground terminal and second ground terminal) and a pair of signal terminals 94 (first signal terminal pair and second signal terminal pair) are repeatedly arranged side by side at equal pitches. Further, a first terminal distance P1, which is a distance between centers of adjacent terminals (between the ground terminal 93 and the adjacent signal terminal 94, and between the pair of signal terminals 94), is set at an equal pitch (for example, P1=0.6 mm). Then, in a region adjacent to the receiver-side terminal row 91, a channel pitch, which is a distance between centers of strip conductor pairs 114 of the receiver-side differential transmission line 2, is set to be three times as large as P1, that is, 1.8 mm when P1 is 0.6 mm. In a region adjacent to the transmitter-side terminal row 92, the channel pitch of the transmitter-side differential transmission line 3 is similarly set to 1.8 mm. In this case, the transmitter-side terminal row 92 is arranged further at one side (lower side in FIG. 5A) of the receiver-side terminal row 91. Further, in each of a terminal row 206 connected to the receiving integrated circuit 106 and a terminal row 207 connected to the transmitting integrated circuit 107, a ground terminal 141 and a pair of signal terminals 142 are repeatedly arranged side by side at equal pitches. A second terminal distance P2, which is a distance between centers of adjacent terminals (between the ground terminal 141 and the adjacent signal terminal 142, and between the pair of signal terminals 142), is set at an equal pitch that is 0.6 mm or less (in this case, P2=0.4 mm). Note that, the ground terminals 93 and the signal terminals 94 in each of the receiver-side terminal row 91 and the transmitter-side terminal row 92 are arranged in the same layer (referred to as "terminal layer") above a ground conductor layer 102 (not shown).

The receiver-side differential transmission line 2 includes four differential transmission lines adjacent to each other, and is configured to transmit signals in a direction from the terminal row 206 to the receiver-side terminal row 91. Further, the transmitter-side differential transmission line 3 includes four differential transmission lines adjacent to each other, and is configured to transmit signals in a direction from the transmitter-side terminal row 92 to the terminal row 207. Each of the differential transmission lines includes the ground conductor layer 102, a dielectric layer 103, and strip conductor pairs 104, 114, and 115. Further, each strip conductor pair (first strip conductor pair) included in the receiver-side differential transmission line 2 includes a right strip conductor 211 (first right strip conductor) arranged at the right side when facing the signal transmission direction, and a left strip conductor 212 (first left strip conductor) arranged at the left side when facing the signal transmission direction. Also in each strip conductor pair (second strip conductor pair) included in the transmitter-side differential transmission line 3, a strip conductor arranged at the right side when facing the signal transmission direction is referred to as the right strip conductor 211 (second right strip conductor), and a strip conductor arranged at the left side when facing the signal transmission direction is referred to as the left strip conductor 212 (second left strip conductor). In this case, the plurality of strip conductor pairs included in the transmitter-side differential transmission line 3 are arranged further at the one side (lower side in FIG. 5A) of the plurality of strip conductor pairs included in the receiver-side differential transmission line 2. As a conductor formed as a signal communication channel, the strip conductor pair 114 in the surface layer is used in a connection region to each terminal of the receiver-side terminal row 91 (or the transmitter-side terminal row 92), and the strip conductor pair 115 in the surface layer is used in a connection region to each terminal of the terminal row 206 (or the terminal row 207). In other regions, the strip conductor pair 104 arranged inside the dielectric layer 103 and in the same layer (referred to as "strip conductor layer") is used. Further, between two adjacent strip conductor pairs 104, a conductor such as metal wiring is not arranged.

The strip conductor pair 114 is electrically connected to the signal terminals 94, and is connected to the strip conductor pair 104 through via holes 109. The via hole 109 is a through via hole formed by, for example, drilling, and is formed for connection between the strip conductor pair 114 and the strip conductor pair 104. The DC cut capacitor 111 is arranged for each strip conductor of the strip conductor pair 114, and is, for example, a 0603-size (0.6 mm×0.3 mm size) surface mounting-type capacitor with a capacitance of 0.1 µF. Note that, the DC cut capacitor 111 may be a different capacitor, or may be omitted. Further, the strip conductor pair 115 is connected to the signal terminals 142, and is connected to the strip conductor pair 104 through via holes 119. Wiring 108 is electrically connected to the ground terminal 93, and is connected to the ground conductor layer 102 through a via hole 110.

Further, a solder resist layer 105 is arranged on the strip conductor pair 114 and the strip conductor pair 115 in the surface layer, but is not arranged on the strip conductor pair 104. In order to protect the circuit pattern, the solder resist layer 105 is formed by being applied in a film form on surface-layer copper foil of a terminal or the like, which requires solder connection. Thermosetting epoxy resin ink is used as the material for forming the solder resist layer 105, and the thickness of the film is suitably 30 to 50 µm.

The primary feature of the present invention resides in the structure of the differential transmission line in a straight line region 300. Now, a part of the strip conductor pair 104 arranged in the straight line region 300 is referred to as "strip conductor pair 124" and described below.

Further, the primary feature of the differential transmission line according to the present invention resides in that, in the straight line region 300, the differential transmission line includes the plurality of strip conductor pairs 124 arranged side by side in the same layer above the ground conductor layer 102, and the dielectric layer 103 for embedding the plurality of strip conductor pairs 124 from the upper side of the ground conductor layer 102. The dielectric layer 103 is formed up to a region above the strip conductor pairs 124, and its upper surface (interface with an outer gas) is formed flat. A region between two adjacent strip conductor pairs 124 is embedded in the dielectric layer 103 without arranging a conductor such as metal wiring in the region. With this, the crosstalk characteristics between the channels can be improved, and a region occupied by the differential transmission line in the printed circuit board 20 can be reduced.

Figure 5B:
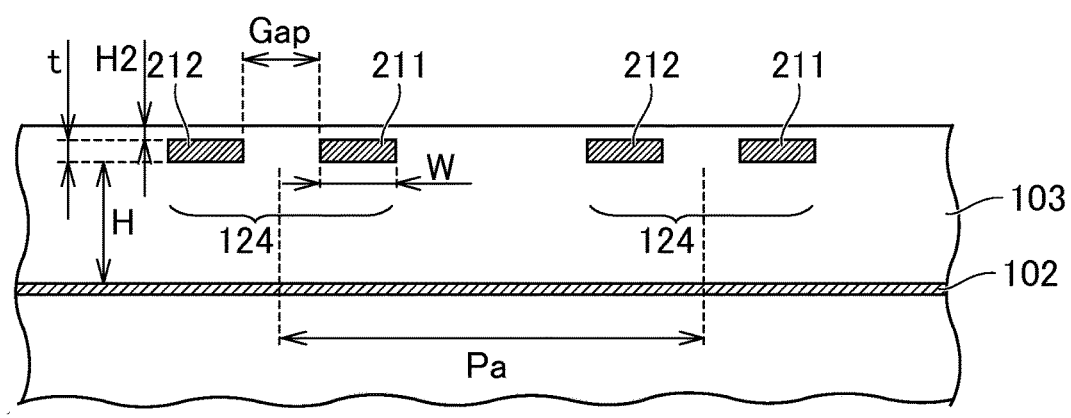
FIG. 5B is a sectional view of the printed circuit board according to the first embodiment of the present invention.

First, the structure of the differential transmission line according to this embodiment is described. FIG. 5B is a sectional view of the differential transmission line according to this embodiment, and illustrates apart of the cross section taken along the line VB-VB of FIG. 5A. FIG. 5B illustrates the structure of the upper layer in the ten-layer printed circuit board 20. As illustrated in FIG. 5B, the differential transmission line includes the ground conductor layer 102, the strip conductor pair 124 (right strip conductor 211 and left strip conductor 212) positioned above the ground conductor layer 102, and the dielectric layer 103 for embedding the strip conductor pair 124 from the upper side of the ground conductor layer 102, the dielectric layer 103 being formed up to a region above the strip conductor pair 124.

The plurality of strip conductor pairs 124 are arranged side by side in the same layer. Further, the plurality of strip conductor pairs 124 are embedded in the dielectric layer 103 without arranging a conductor or the like between two adjacent strip conductor pairs 124. Note that, copper foil is used as the material for forming the strip conductor pair 124 and the ground conductor layer 102.

The dielectric layer 103 is formed with use of a glass epoxy resin containing a glass fabric base and an epoxy resin. The relative permittivity of the dielectric layer 103 is, for example, 3.6. Further, the interface between the upper surface of the dielectric layer 103 and the outer gas (such as air and nitrogen gas) is formed flat.

Note that, the dielectric layer 103 is made of a glass epoxy resin having a relative permittivity of 3.6, but the relative permittivity of the dielectric layer 103 is not limited thereto. For example, the material for forming the dielectric layer 103 may be FR4 or FR5, which is a typical material containing a glass fabric base and an epoxy resin, and the relative permittivity of the dielectric layer 103 may be 4.0 to 4.8. Further, in order to reduce a loss due to high-frequency waves, as the material for forming the dielectric layer 103, a material containing a glass fabric base and polytetrafluoroethylene (PTFE) may be used. In this case, the relative permittivity of the dielectric layer 103 may be 2.0 to 2.3.

In this case, as illustrated in FIG. 5B, in each portion of the differential transmission line, a strip conductor width W represents each of the width of the right strip conductor 211 and the width of the left strip conductor 212 of the strip conductors, a strip conductor gap Gap represents a gap between the strip conductors (distance between the inner edge of the right strip conductor 211 and the inner edge of the left strip conductor 212), a distance H represents a distance from the upper surface of the ground conductor layer 102 to the lower surface of the strip conductor, a strip conductor thickness t represents the thickness of the strip conductor, and a distance H2 represents a distance from the upper surface of the strip conductor to the outer gas.

Next, the structure of the straight line region 300 according to this embodiment is described. In order to structure the straight line region 300 as described above, first, the strip conductor pair 104 arranged at the outermost side of the plurality of strip conductor pairs 104 included in the receiver-side differential transmission line 2 (hereinafter referred to as "outer strip conductor pair") is linearly extended from the via hole 109 to the via hole 119. Then, with reference to the outer strip conductor pair, the respective strip conductor pairs 104 are arranged with the channel pitch Pa of 1.1 mm. Specifically, the strip conductor pairs 104 other than the outer strip conductor pair are each bent at an angle θ (for example, 45°) in a direction from the via hole 109 toward the outer strip conductor pair, and extended parallel to the outer strip conductor pair after reaching the channel pitch Pa of 1.1 mm. Then, the strip conductor pairs 104 other than the outer strip conductor pair are bent and extended so as to be connected to the via hole 119 in the vicinity of the via hole 119. With this, such a straight line region 300 that the receiver-side differential transmission line 2 is extended while maintaining the channel pitch Pa of 1.1 mm is formed. That is, in the straight line region 300, the centers of the plurality of strip conductor pairs 124 (first strip conductor pairs) included in the receiver-side differential transmission line 2 are arranged at another side (upper side in FIG. 5A) with respect to the center of the receiver-side terminal row 91, and the centers of the plurality of strip conductor pairs 124 (second strip conductor pairs) included in the transmitter-side differential transmission line 3 are arranged at the one side (lower side in FIG. 5A) with respect to the center of the transmitter-side terminal row 92. Further, in the straight line region 300, the distance between the centers (channel pitch Pa) of the two adjacent strip conductor pairs 124 (first strip conductor pairs) included in the receiver-side differential transmission line 2 is smaller than the distance between the centers (1.8 mm) of the corresponding two adjacent pairs of signal terminals 94 (first signal terminal pairs). Similarly, the distance between the centers (channel pitch Pa) of the two adjacent strip conductor pairs 124 (second strip conductor pairs) included in the transmitter-side differential transmission line 3 is smaller than the distance between the centers (1.8 mm) of the corresponding two adjacent pairs of signal terminals 94 (second signal terminal pairs). As described above, it is possible to narrow the region occupied by the differential transmission line in the printed circuit board 20 while reducing the crosstalk amount between the differential transmission lines. In addition, it is possible to arrange other mounting components and form through via holes for inner layer wiring connection in a region at the further inner side of the strip conductor pair 104 arranged at the innermost side of the plurality of strip conductor pairs 104 included in the receiver-side differential transmission line 2 (hereinafter referred to as "inner strip conductor pair"). Further, the transmitter-side differential transmission line 3 can also have a structure similar to the above-mentioned structure of the receiver-side differential transmission line 2.

Now, the characteristics of the differential transmission line according to this embodiment are described. In the following, the receiver-side differential transmission line 2 is exemplified so as to describe the characteristics of the differential transmission line in the straight line region 300, but the characteristics may also be applied to the transmitter-side differential transmission line 3. Thus, the differential transmission lines according to this embodiment described below include the receiver-side differential transmission line 2 and the transmitter-side differential transmission line 3.

First, as the characteristics of the differential transmission line, an influence of a channel length L on the crosstalk characteristics is described.

Figure 6:
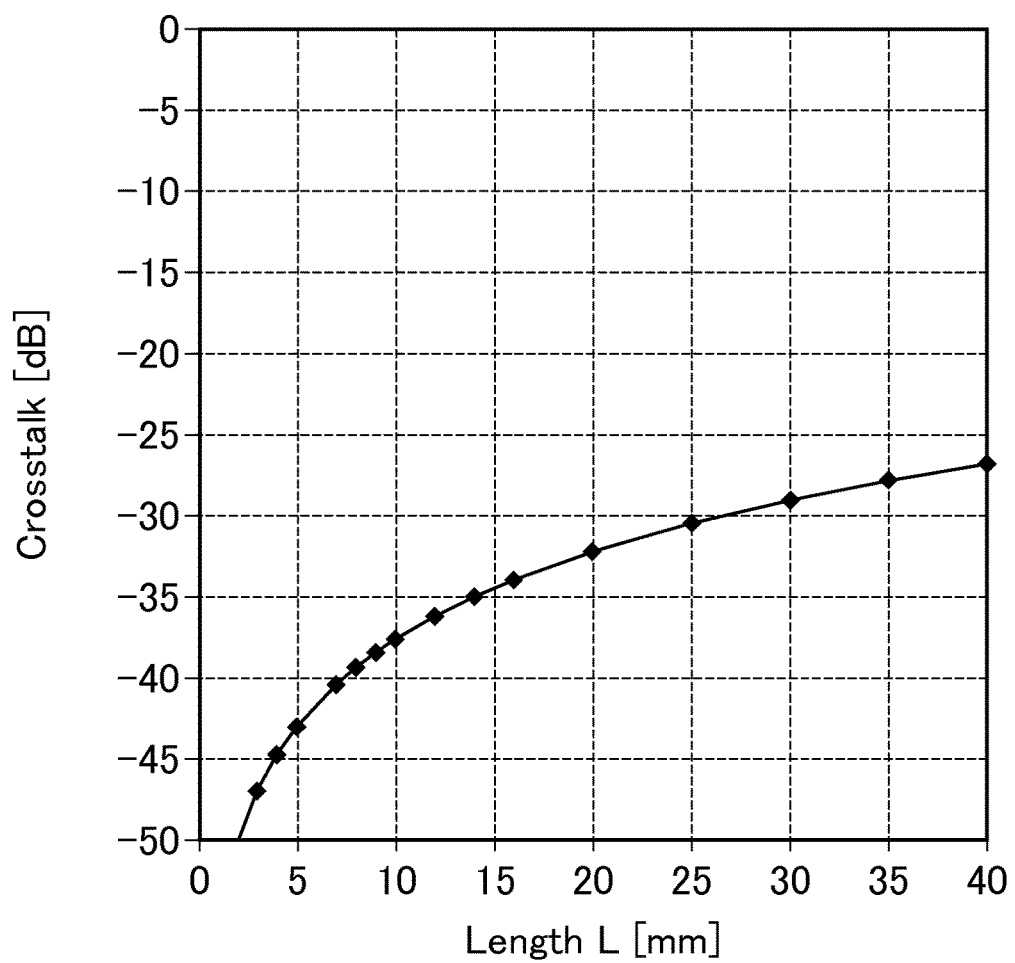
FIG. 6 is a graph showing crosstalk characteristics with respect to a channel length L of a differential transmission line according to the first embodiment of the present invention.

FIG. 6 is a graph showing an example of the crosstalk characteristics with respect to the channel length L of the differential transmission line according to this embodiment. FIG. 6 shows the maximum value of the crosstalk in the frequency range of from 0 Hz to 30 GHz when the channel length L is changed in a range of from 2 mm to 40 mm assuming that the channel pitch Pa is 1.5 mm, the strip conductor gap Gap is 0.2 mm, the distance H is 0.279 mm, the strip conductor thickness t is 35 μm, and the distance H2 is 60 μm. As shown in FIG. 6, in the frequency range of from 0 Hz to 30 GHz, the crosstalk amount monotonically increases along with the increase in the channel length. In this embodiment, when the length of the straight line region 300 is 7 mm or more, components necessary for constructing the optical module 1 can be arranged. In view of this, it is desired that the crosstalk amount be −35 dB or less, and thus the permitted value of the crosstalk amount is set to −35 dB. As shown in FIG. 6, in order to realize the crosstalk amount of −35 dB or less, the channel length L is desired to be 14 mm or less. In this embodiment, the permitted value of the crosstalk amount is set to −35 dB, and the structure of the differential transmission line having the channel length L of 14 mm is described. Note that, even with a different channel length, it is possible to set the structure of the differential transmission line so as to satisfy the permitted value of the crosstalk amount in accordance with the channel length.

Next, the influence of the channel pitch Pa on the crosstalk characteristics is described. First, the inventors of the present invention considered the differential transmission lines according to the first prior art and the second prior art described below for comparison with the differential transmission line according to this embodiment.

Figure 7:
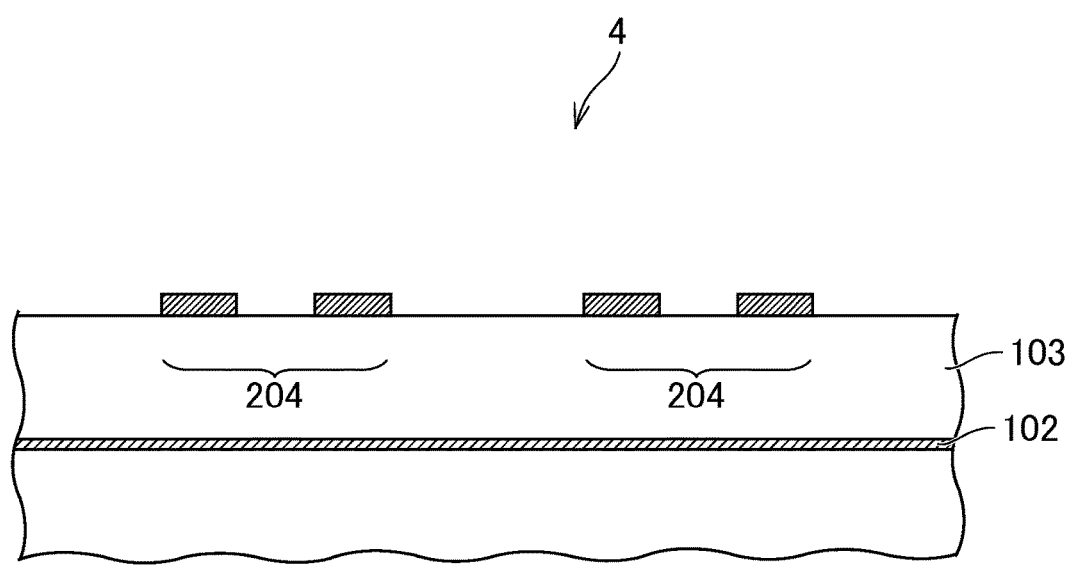
FIG. 7 is a sectional view illustrating the structure of the differential transmission line according to the first prior art.

FIG. 7 is a sectional view illustrating a structure of a differential transmission line 4 according to the first prior art. FIG. 7 illustrates the structure of the upper layer in the printed circuit board. As illustrated in FIG. 7, the differential transmission line 4 according to the first prior art is constructed so that the ground conductor layer 102 is arranged at one side of the dielectric layer 103, and strip conductor pairs 204 are arranged at the other side of the dielectric layer 103. Further, the strip conductor pairs 204 are not embedded in the dielectric layer 103, but arranged on the upper surface of the dielectric layer 103 so as to be exposed to the outer gas. When the outer gas is air, the relative permittivity and the relative permeability of air are both 1.0, which differs from the dielectric layer 103 according to this embodiment illustrated in FIG. 5B only in the relative permittivity. Therefore, there is no difference therebetween in magnetic field distribution.

Figure 8:
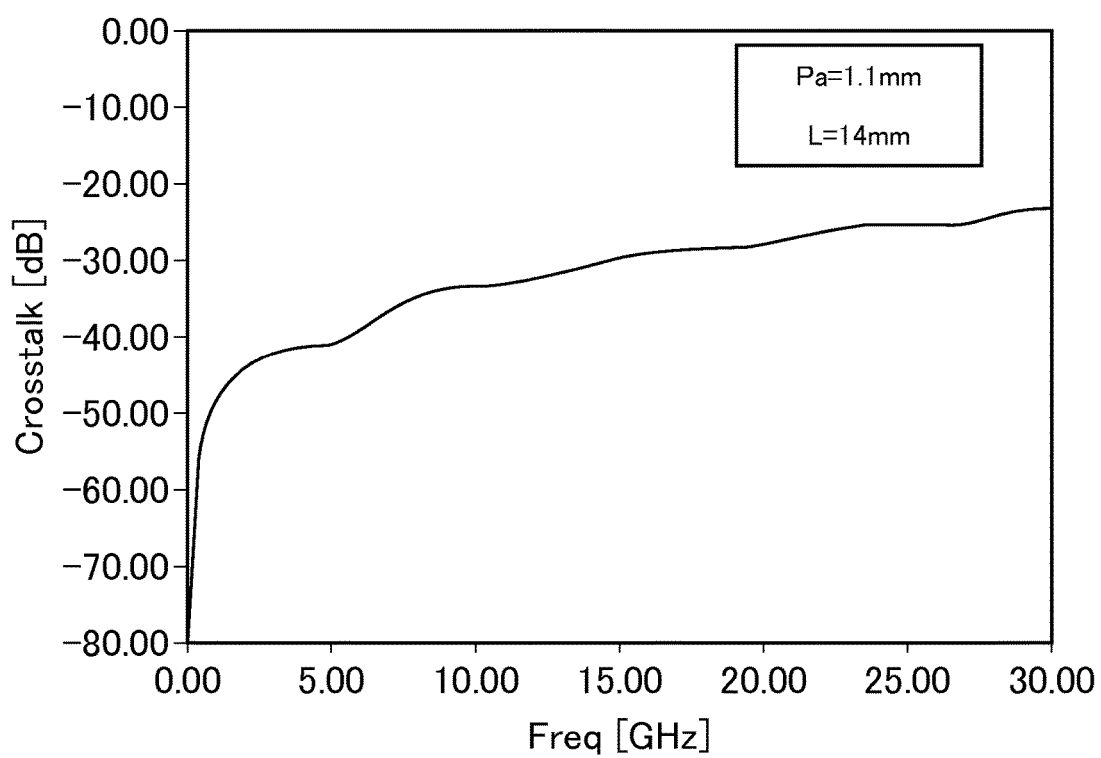
FIG. 8 is a graph showing crosstalk characteristics of the differential transmission line according to the first prior art.
Figure 15:
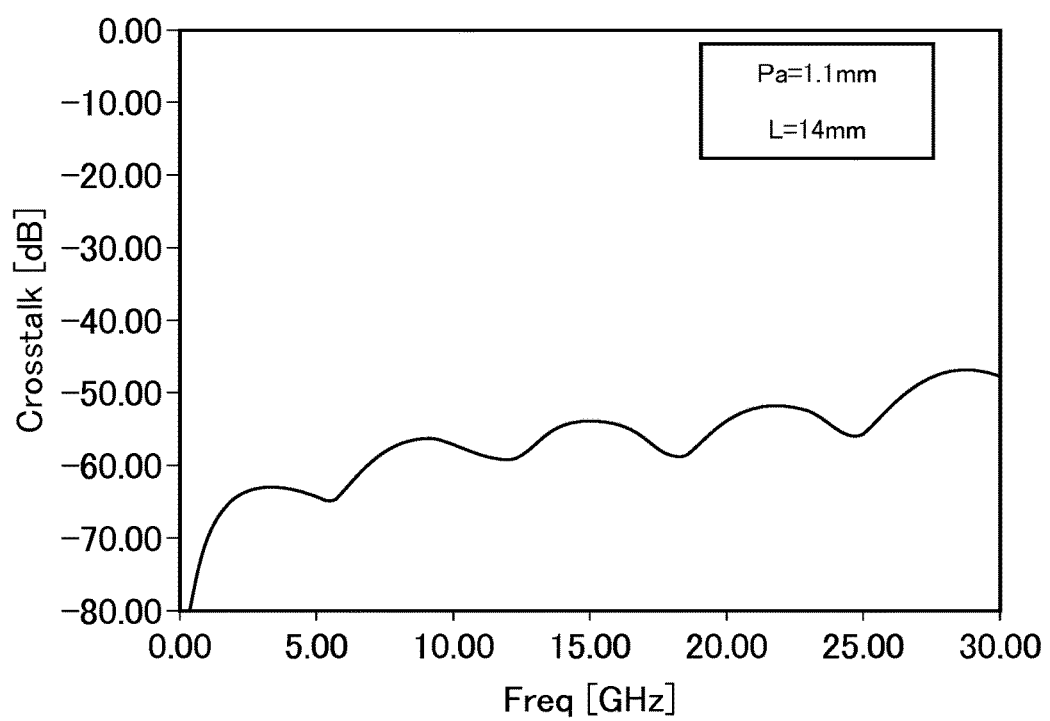
FIG. 15 is a graph showing crosstalk characteristics between the channels of the differential transmission line according to the first embodiment of the present invention.

FIG. 8 is a graph showing the crosstalk characteristics of the differential transmission line 4 according to the first prior art. FIG. 8 shows the crosstalk characteristics with respect to the frequency when the differential transmission line 4 according to the first prior art is arranged in the straight line region 300 according to this embodiment. In this case, the crosstalk characteristics are calculated assuming that the channel length L is 14 mm and the channel pitch Pa is 1.1 mm. As shown in FIG. 8, in the differential transmission line 4 according to the first prior art, the maximum crosstalk amount is −23 dB in the frequency range of 0 Hz to 30 GHz. Thus, the crosstalk characteristics are deteriorated as compared to the differential transmission line according to this embodiment. As understood through comparison with FIG. 15 showing the crosstalk characteristics of the differential transmission line according to this embodiment to be described below, the present invention produces a remarkable effect. As described above, the crosstalk characteristics can be improved by forming the dielectric layer 103 up to a region above the strip conductor pair 124 as illustrated in FIG. 5B.

Figure 9:
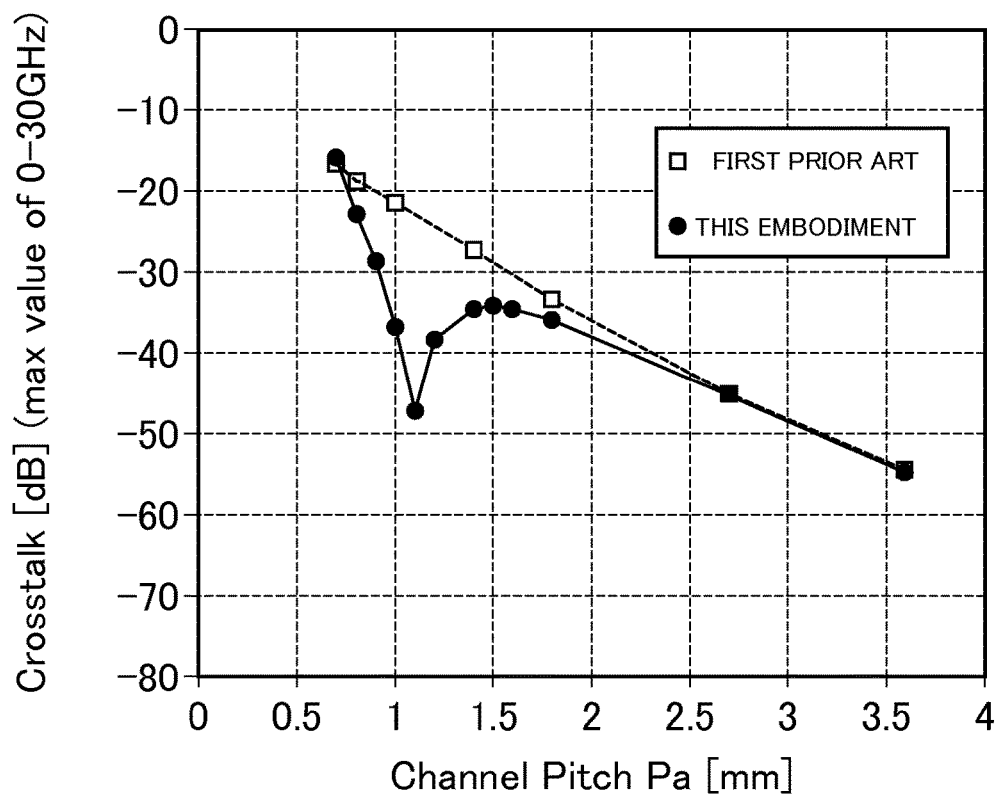
FIG. 9 is a graph showing crosstalk characteristics with respect to a channel pitch Pa of the differential transmission line according to the first embodiment of the present invention.

FIG. 9 is a graph showing the crosstalk characteristics with respect to the channel pitch Pa of the differential transmission line according to this embodiment, which also shows the crosstalk characteristics of the differential transmission line 4 according to the first prior art. Note that, the crosstalk characteristics shown in FIG. 9 are calculated assuming that the channel length L is 14 mm, the frequency range is from 0 to 30 GHz, and the channel pitch Pa is from 0.7 mm to 3.6 mm. As shown in FIG. 9, in the case of the differential transmission line 4 according to the first prior art, the crosstalk amount monotonically increases as the channel pitch Pa is reduced. On the other hand, in the case of the differential transmission line according to this embodiment, when the channel pitch Pa is sufficiently large (Pa>2.7 mm), there is little difference in crosstalk amount as compared to the case of the differential transmission line 4 according to the first prior art. However, as the channel pitch Pa becomes narrower than 2.7 mm, the crosstalk amount gradually reduces. After reaching the local maximum value (Pa=1.5 mm), the crosstalk amount steeply decreases. Then, at the channel pitch Pa of 1.1 mm, the crosstalk amount reaches the local minimum value, and then steeply increases. Then, the crosstalk amount approaches the crosstalk amount of the differential transmission line 4 according to the first prior art.

As described above, it is understood that, in the differential transmission line 4 according to the first prior art, the crosstalk amount increases as the channel pitch Pa becomes narrower. In contrast, in the differential transmission line according to this embodiment, as the channel pitch Pa is gradually narrowed, the crosstalk amount steeply reduces in a certain range.

In view of this, when the phase of the signal transmitted to the adjacent channel due to the crosstalk and the phase of the signal transmitted to the correct channel are compared to each other, in the differential transmission line 4 according to the first prior art, the phase of the signal due to the crosstalk is advanced by 90° regardless of the value of the channel pitch Pa. In other words, it can be said that, in the differential transmission line 4 according to the first prior art, capacitive coupling is a dominant cause of the crosstalk. On the other hand, in the differential transmission line according to this embodiment, when the channel pitch Pa is sufficiently large (Pa>2.7 mm), the phase of the signal due to the crosstalk is advanced by 90°, but in the vicinity of Pa=0.8 mm where the crosstalk steeply increases in FIG. 9, the phase of the signal due to the crosstalk is retarded by 90°. In other words, it can be said that, when Pa>2.7 mm is satisfied, capacitive coupling is a dominant cause of the crosstalk, while in the vicinity of Pa=0.8 mm, inductive coupling is a dominant cause of the crosstalk. In the range of 0.8 mm≤Pa≤2.7 mm, the influence of the capacitive coupling and the influence of the inductive coupling are substantially the same, and they have forces in the opposite directions. Thus, a cancel effect is thought to be generated. Therefore, in this embodiment, the crosstalk amount reduces in the range of 0.8 mm≤Pa≤2.7 mm, and the local maximum value and the local minimum value are obtained at Pa=1.5 mm and Pa=1.1 mm, respectively.

Next, crosstalk characteristics of a differential transmission line 5 according to the second prior art are described.

Figure 10:
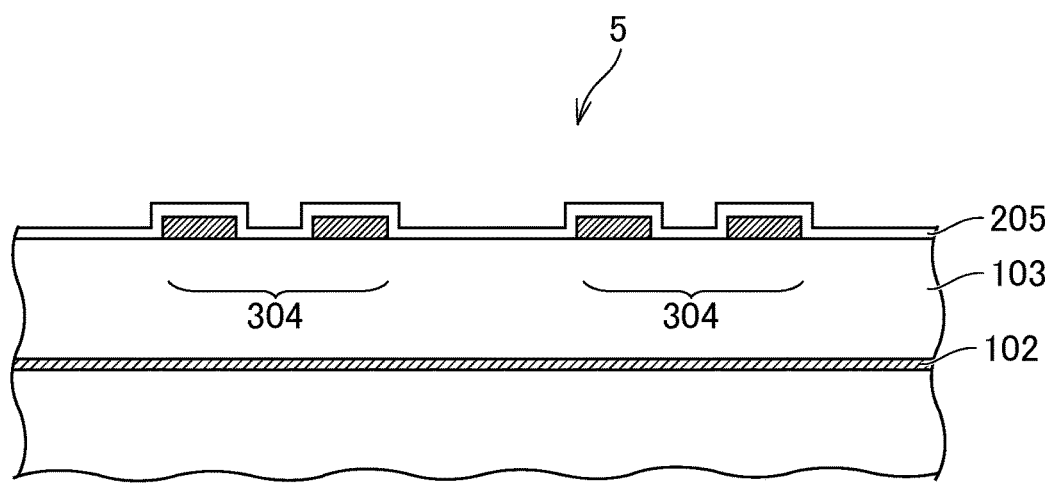
FIG. 10 is a sectional view illustrating the structure of the differential transmission line according to the second prior art.

FIG. 10 is a sectional view illustrating the structure of the differential transmission line 5 according to the second prior art. FIG. 10 illustrates the structure of the upper layer in the printed circuit board. As illustrated in FIG. 10, in the differential transmission line 5 according to the second prior art, strip conductor pairs 304 are arranged above the upper surface of the ground conductor layer 102 through intermediation of the dielectric layer 103, and a solder resist layer 205 is formed on the upper surfaces of the strip conductor pairs 304 and the upper surface of the dielectric layer 103. The solder resist layer 205 is formed by being applied in a film form on the upper surfaces of the strip conductor pairs 304 and the upper surface of the dielectric layer 103. Therefore, irregularities are formed at each step between the upper surface of the strip conductor pair 304 and the upper surface of the dielectric layer 103 between the channels. Therefore, the interface between the solder resist layer 205 and the outer gas is not formed flat. In this case, for example, it is assumed that the thickness of the strip conductor pair 304 is 60 μm, the thickness of the solder resist layer 205 is 30 μm, the channel length L is 14 mm, the channel pitch Pa is 1.1 mm, and the relative permittivity of the solder resist layer 205 is 4.4.

Figure 11:
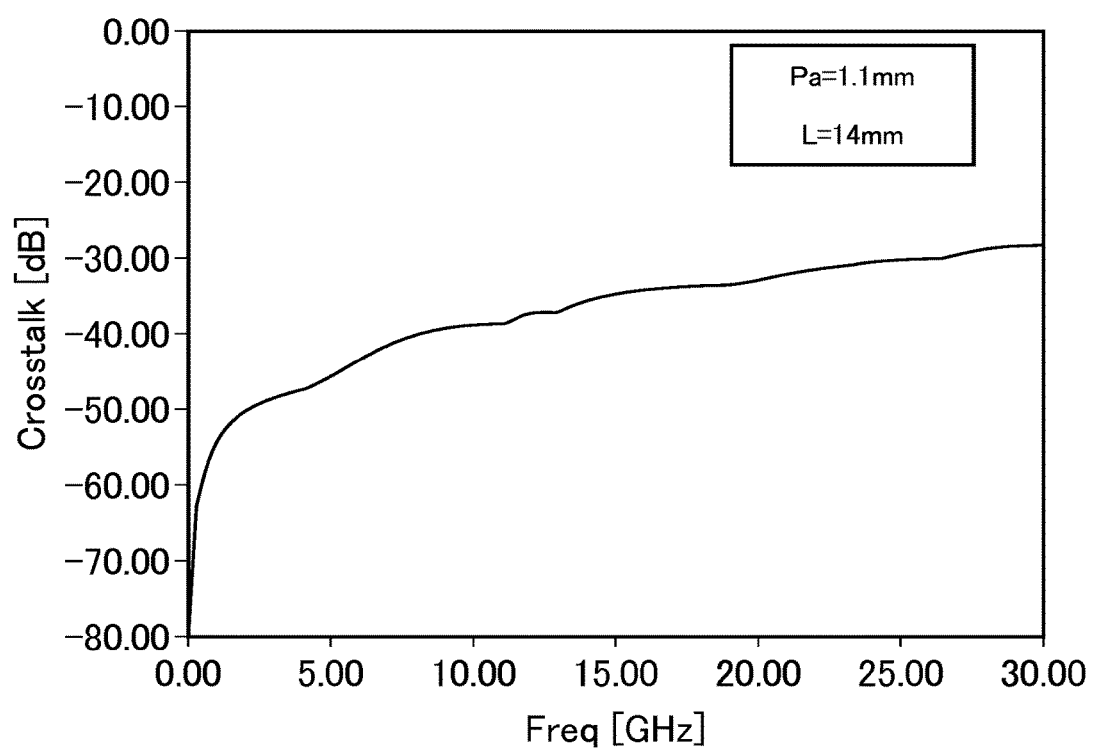
FIG. 11 is a graph showing crosstalk characteristics of the differential transmission line according to the second prior art.

FIG. 11 is a graph showing the crosstalk characteristics of the differential transmission line 5 according to the second prior art. FIG. 11 shows the crosstalk characteristics with respect to the frequency when the differential transmission line 5 according to the second prior art is arranged in the printed circuit board 20 according to this embodiment. Similarly to FIG. 8, the crosstalk characteristics are calculated assuming that the channel length L is 14 mm and the channel pitch Pa is 1.1 mm. As shown in FIG. 11, in the frequency range of from 0 Hz to 30 GHz, the maximum crosstalk amount is −28 dB. As described above, it is understood that, even if a dielectric (solder resist layer 205) is arranged on the strip conductor pair 304, when the interface between the dielectric and the outer gas is not flat, the effect of reducing the crosstalk amount cannot be obtained. In other words, it can be said that, in order to obtain the effect of reducing the crosstalk amount, it is important to form the upper surface of the dielectric layer 103 into such a flat surface that the step due to the thickness of the strip conductor pair is insensible.

Now, the dimensional conditions of respective portions of the differential transmission line for satisfying the permitted value (−35 dB) of the crosstalk when the channel length L is 14 mm are described.

Figure 12:
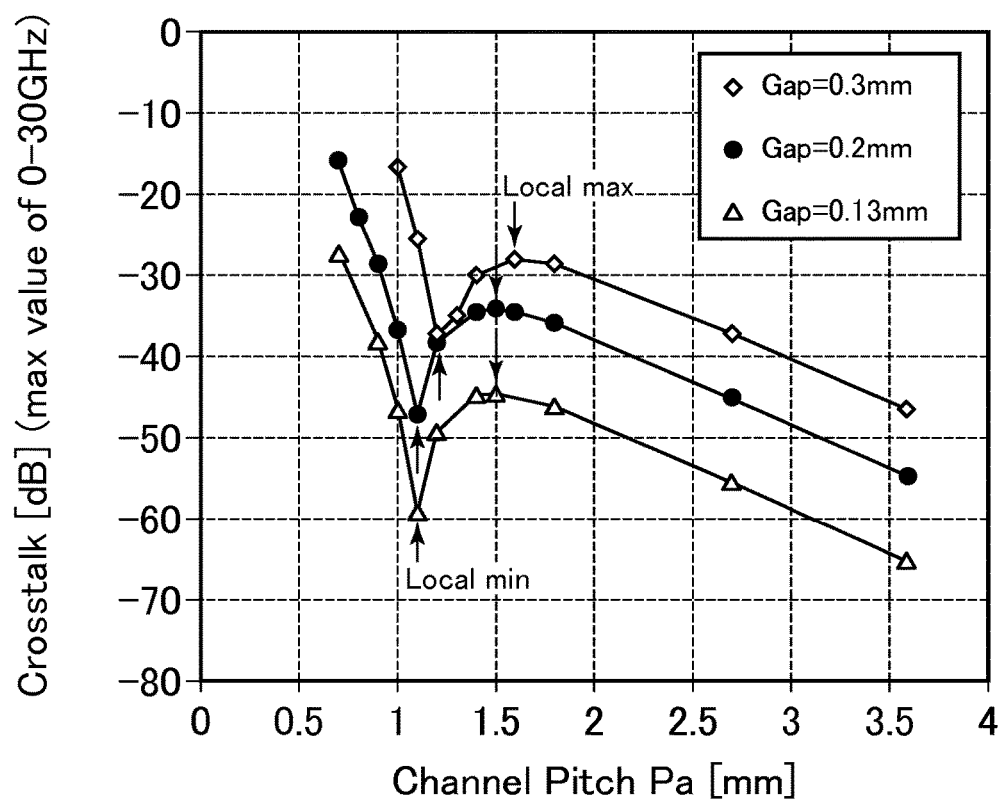
FIG. 12 is a graph showing crosstalk characteristics with respect to the channel pitch Pa of the differential transmission line according to the first embodiment of the present invention.

FIG. 12 is a graph showing the crosstalk characteristics with respect to the channel pitch Pa of the differential transmission line according to this embodiment. FIG. 12 shows cases where the strip conductor gaps Gap are 0.13 mm (Δ), 1.20 mm (•), and 0.30 mm (◊), respectively. In order to set the structure of the differential transmission line so as to reduce the crosstalk amount between the channels of the differential transmission line and to narrow the arrangement region of the differential transmission line, first, the channel pitch Pa_max when the crosstalk amount takes the local maximum value is obtained, and next the channel pitch Pa_min when the crosstalk amount takes the local minimum value is obtained. Then, the channel pitch Pa is suitably set within the range of Pa_max≥Pa≥Pa_min. As shown in FIG. 12, the size of the strip conductor gap Gap dominantly determines the magnitude of the crosstalk amount. In particular, the value of the strip conductor gap Gap substantially uniquely determines the magnitude of the local maximum value of the crosstalk amount.

Figure 13:
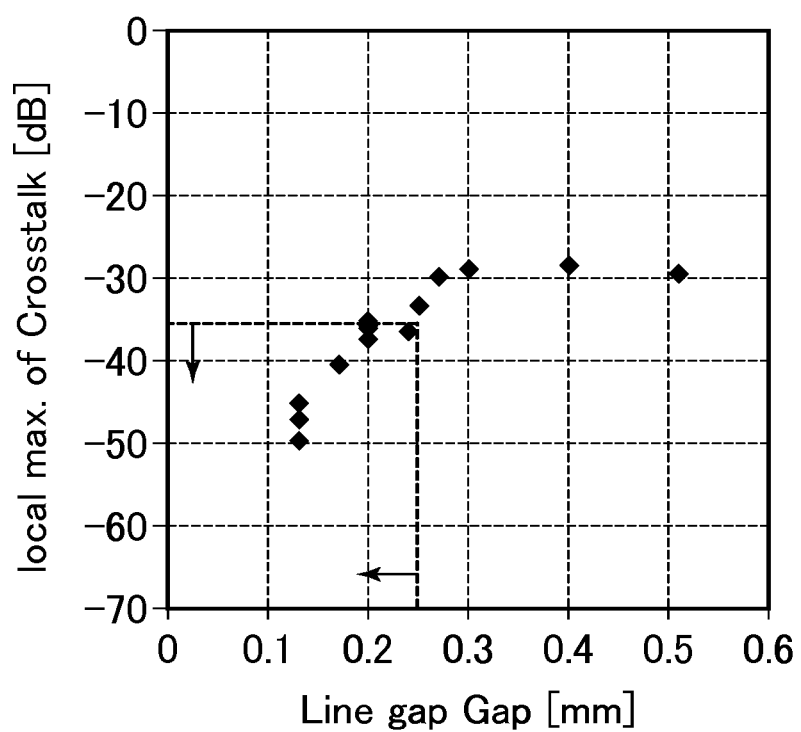
FIG. 13 is a correlation graph of the differential transmission line according to the first embodiment of the present invention.

FIG. 13 is a correlation graph of the differential transmission line according to this embodiment. In FIG. 13, the local maximum value of the crosstalk amount is obtained in various structures of differential transmission lines (differential transmission lines arbitrary changed in the strip conductor gap Gap, the distance H, the strip conductor thickness t, the strip conductor width W, and the distance H2), and the correlation between the strip conductor gap Gap and the local maximum value of the crosstalk amount is shown. As shown in FIG. 13, when the strip conductor gap Gap is set to 0.25 mm or less, the crosstalk amount can be equal to or less than −35 dB, which is the permitted value.

Figure 14:
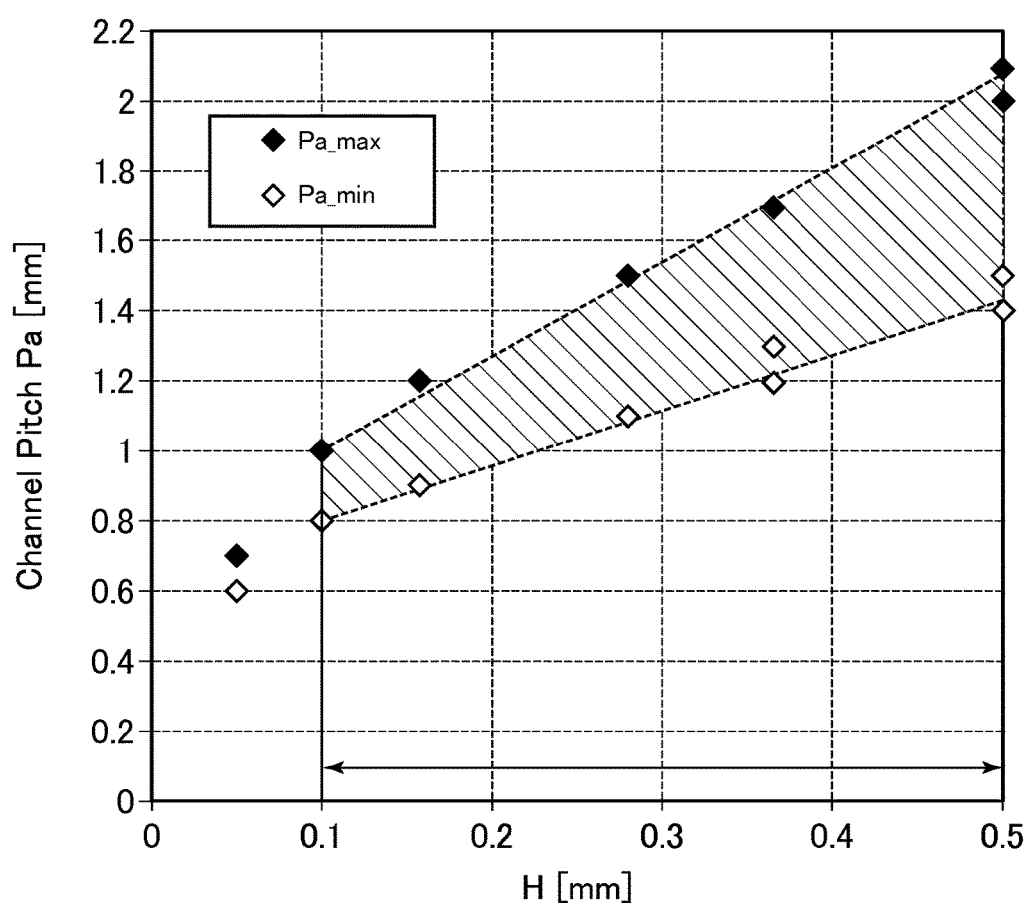
FIG. 14 is a correlation graph of the differential transmission line according to the first embodiment of the present invention.

FIG. 14 is a correlation graph of the differential transmission line according to this embodiment. In FIG. 14, in the differential transmission line having the strip conductor gap Gap limited to 0.25 mm or less, Pa_max (♦) and Pa_min (◇) when the distance H is changed are obtained, and the correlation between the distance H and the channel pitch Pa is shown. In other words, it can be said that FIG. 14 shows the combination (range) of H and Pa in which the crosstalk amount becomes −35 dB or less. As shown in FIG. 14, in order to reduce the crosstalk amount between the channels and narrow the region occupied by the arrangement region of the differential transmission line, the distance H is suitably set to 0.1 mm≤H≤0.5 mm, and the channel pitch Pa is suitably set within the range of Pa_min≤Pa≤Pa_max (range of the shaded part shown in FIG. 14). For example, when the distance H is set to 0.5 mm, the channel pitch Pa is suitably set within the range of 1.4 mm≤Pa≤2.1 mm. Further, for example, when the distance H is set to 0.1 mm, the channel pitch Pa is suitably set within the range of 0.8 mm≤Pa≤1.0 mm. That is, when the distance H is set as an x coordinate and the channel pitch Pa is set as a y coordinate, it is desired that (H, Pa) be arranged on or inside a range of a rectangle having vertices of (0.1 mm, 1.0 mm), (0.1 mm, 0.8 mm), (0.5 mm, 1.4 mm), and (0.5 mm, 2.1 mm). Further, when the distance H and the channel pitch Pa are determined, W and the like may be determined so that the characteristic impedance of the differential transmission line becomes a desired value. Note that, it is clear based on FIG. 6 that the range shown in FIG. 14 can attain the crosstalk amount of −35 dB or less not only at L=14 mm but also when L≤14 mm is satisfied.

Thus, it is desired that the length of each of the plurality of first strip conductor pairs according to the present invention be 14 mm or less. Note that, the length of the first strip conductor pair refers to a length of a part of a first strip conductor pair embedded in the dielectric layer without arranging a conductor (metal wiring) between the first strip conductor pair and a first strip conductor pair positioned adjacent thereto. Further, as shown in FIG. 13, it is desired that the strip conductor gap Gap of each of the plurality of first strip conductor pairs be 0.25 mm or less. Further, as shown in FIG. 14, it is desired that the distance H and the channel pitch Pa between two adjacent first strip conductor pairs represent a combination positioned on or inside the range of the rectangle (shaded part) shown in FIG. 14.

Now, the crosstalk characteristics of a case where the differential transmission line satisfying the dimensional conditions of the respective portions described above is arranged in the straight line region 300 according to this embodiment are verified. Note that, the channel length L is set to 14 mm, and the length of each channel in the region 300 is set to, as illustrated in FIG. 5A, A1=9 mm, A2=8 mm, and A3=7 mm from the outer side of the printed circuit board 20.

First, the printed circuit board 20 is shaped based on the above-mentioned CFP4 MSA standard. Then, the distance H is set to 0.279 mm, the strip conductor thickness t is set to 35 μm, and the distance H2 is set to 60 μm. Then, the thickness of the dielectric layer 103 between the ground conductor layer 102 and the outer gas in a region between the channels is set to 0.374 mm (distance H+strip conductor thickness t+distance H2). The strip conductor gap Gap is set to 0.20 mm. The strip conductor width W is set so that a characteristic impedance Zdiff of the differential transmission line becomes a desired value. In this case, the strip conductor width W is set to 0.2 mm. The channel pitch Pa is set based on the value of the distance H. In this case, based on H=0.279, Pa is set to 1.1 mm.

FIG. 15 is a graph showing crosstalk characteristics between the channels of the differential transmission line according to this embodiment. FIG. 15 shows the crosstalk characteristics between the channels of the differential transmission line in the above-mentioned printed circuit board 20. As shown in FIG. 15, in the frequency range of from 0 Hz to 30 GHz, the crosstalk amount is −47 dB or less. As described above, when the differential transmission line satisfying the above-mentioned conditions is used, the region occupied by the differential transmission line can be narrowed while reducing the crosstalk between the channels of the differential transmission line.

Further, when the receiver-side differential transmission line 2 and the transmitter-side differential transmission line 3 of the printed circuit board 20 according to this embodiment include the differential transmission line satisfying the above-mentioned conditions, for example, as illustrated in FIG. 5A, a wiring gap D between the receiver-side differential transmission line 2 and the transmitter-side differential transmission line 3 can be increased up to 7.2 mm. The wiring gap D herein refers to a gap between the receiver-side differential transmission line 2 and the transmitter-side differential transmission line 3. That is, the wiring gap D herein refers to, as illustrated in FIG. 5A, a distance between an edge on the transmitter-side differential transmission line 3 side of a strip conductor positioned on the most transmitter-side differential transmission line 3 side of the plurality of strip conductors included in the receiver-side differential transmission line 2 and an edge on the receiver-side differential transmission line 2 side of a strip conductor positioned on the most receiver-side differential transmission line 2 side of the plurality of strip conductors included in the transmitter-side differential transmission line 3. As described above, when the wiring gap between the receiver-side differential transmission line 2 and the transmitter-side differential transmission line 3 is increased, there is produced such an effect that backward crosstalk from the transmitter-side channel to the receiver-side channel can also be reduced. The backward crosstalk herein refers to, when two pairs of differential transmission lines for propagation in opposite directions have regions where the differential transmission lines are arranged close and parallel to each other, crosstalk generated in the close regions.

Note that, in U.S. Pat. No. 8,344,821, there is proposed a structure of a plurality of differential transmission lines formed of strip conductor pairs, but at least four layers, that is, the terminal wiring layer for connector connection, which is arranged on one surface of the printed circuit board, the underlying ground wiring layer, the underlying signal layer, and the underlying ground wiring layer, are occupied for the differential transmission lines. Thus, this structure cannot respond to the increase in packaging density. Then, in U.S. Pat. Nos. 8,336,203 and 8,212,149 and Japanese Patent Application Laid-open No. 2004-304134, there is a description that the amount of the forward crosstalk can be reduced by selectively arranging a dielectric such as a solder resist on a part of the structure of the plurality of differential transmission lines formed of the strip conductor pairs or by changing the thickness of the dielectric. In view of this, the structures described in U.S. Pat. Nos. 8,336,203 and 8,212,149 and Japanese Patent Application Laid-open No. 2004-304134 were applied to the printed circuit board 20 based on the CFP4 MSA standard as illustrated in FIG. 5A, and the crosstalk characteristics were studied. As a result, it was made clear that the effect of reducing the crosstalk amount was unobtainable, or the effect was insufficient. Also based on this point, it is understood that the present invention can produce remarkable effects that the crosstalk amount can be reduced, the region occupied by the differential transmission line can be narrowed, and the speed and packaging density can be increased.

Further, in terms of reducing the transmission loss in the differential transmission line, it is general to select a material with a small dissipation factor, such as a glass epoxy resin, as the dielectric layer 103. Therefore, when a material with a high dissipation factor, such as a solder resist, is used as the dielectric layer 103, there has been a problem in that the transmission loss cannot be sufficiently reduced. In contrast, in the differential transmission line of this embodiment, the solder resist layer is omitted. Thus, the transmission loss of the differential transmission line can be suppressed to the minimum, which produces an effect that the signal integrity can be satisfactorily secured.

Figure 16A:
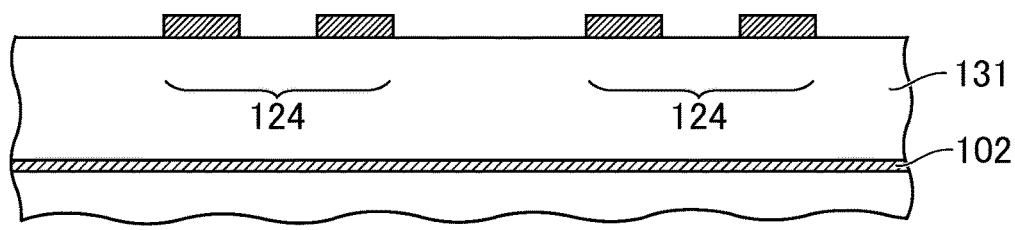
FIG. 16A is a view schematically illustrating a process of a method of manufacturing a differential transmission line according to the first embodiment of the present invention.
Figure 16B:
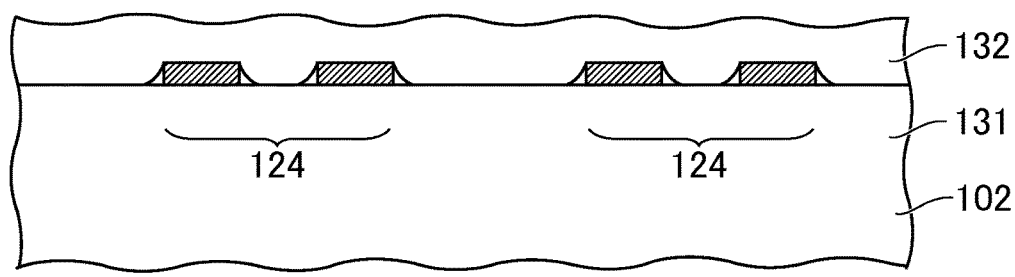
FIG. 16B is a view schematically illustrating the process of the method of manufacturing a differential transmission line according to the first embodiment of the present invention.
Figure 16C:
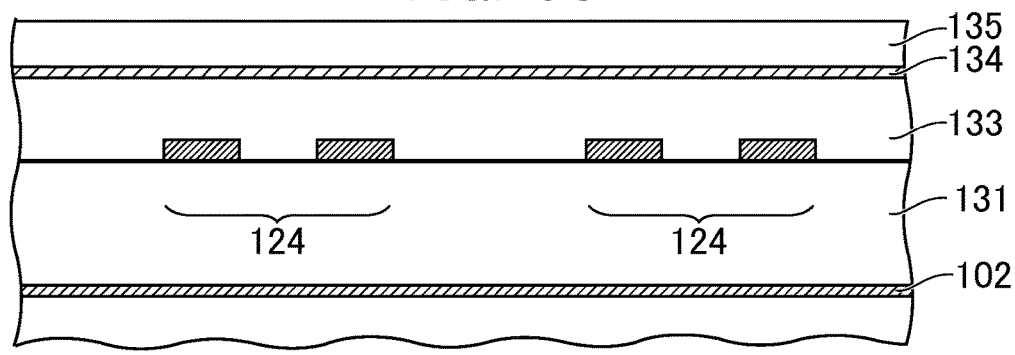
FIG. 16C is a view schematically illustrating the process of the method of manufacturing a differential transmission line according to the first embodiment of the present invention.
Figure 16D:
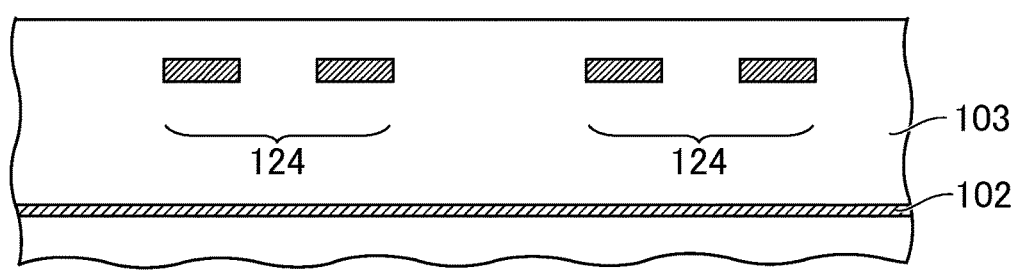
FIG. 16D is a view schematically illustrating the process of the method of manufacturing a differential transmission line according to the first embodiment of the present invention.

Now, a method of manufacturing a differential transmission line according to this embodiment is described with reference to FIGS. 16A to 16D. FIGS. 16A to 16D are views schematically illustrating the process of the method of manufacturing the differential transmission line according to this embodiment. In the method of manufacturing the differential transmission line according to this embodiment, first, the ground conductor layer 102 is formed on the printed circuit board 20. Then, on the ground conductor layer 102, a material containing a glass fabric base and an epoxy resin (first glass epoxy resin) is thermally cured, to thereby form a first dielectric layer 131 in a cured state. Then, the plurality of strip conductor pairs 104 made of copper foil are formed so as to be arranged side by side on the first dielectric layer 131 (FIG. 16A). As illustrated in FIG. 16A, a structure in which the first dielectric layer 131 is formed on the upper surface of the ground conductor layer 102, and the strip conductor pairs 104 are formed on the upper surface of the first dielectric layer 131 is referred to as "differential transmission line basic structure" (the above refers to "differential transmission line basic structure forming step"). Next, a prepreg dielectric 132 that is a glass epoxy resin in a semi-cured state is formed (the above refers to "prepreg dielectric forming step": FIG. 16B). The prepreg dielectric 132 is obtained by impregnating the glass fabric base into the epoxy resin, and heating and drying the resultant to obtain the epoxy resin in the semi-cured state. Then, as illustrated in FIG. 16B, the prepreg dielectric 132 is bonded on both surfaces of the uppermost layer and the lowermost layer (not shown) (that is, upper and lower surfaces) of the differential transmission line basic structure. Then, copper foil 134 having a uniform thickness is bonded on the upper surface of the prepreg dielectric 132 in the uppermost layer and the lower surface of the prepreg dielectric 132 in the lowermost layer. Then, with use of a planar heating platen 135, both the surfaces of the uppermost layer and the lowermost layer are heated in a pressurized state, to thereby thermally cure the prepreg dielectric 132 (FIG. 16C). In FIG. 16C, a second dielectric layer 133 is formed by thermally curing the prepreg dielectric 132 (the above refers to "second dielectric layer forming step"). After that, the via hole 109 (not shown) is formed by a laser via step between the copper foil 134 in the uppermost layer and the strip conductor pair 104, and subsequently the copper foil 134 in the outermost layer is patterned, to thereby form the strip conductor pair 114, the receiver-side terminal row 91, the metal wiring 108, and the like. Then, as illustrated in FIG. 16D, in the straight line region 300, the copper foil 134 in the uppermost layer is removed (metal foil removing step). With this, the interface between the outer gas and the upper surface of the dielectric layer 103 including the first dielectric layer 131 and the second dielectric layer 133 can be formed flat.

Second Embodiment

A second embodiment of the present invention represents a differential transmission line having a structure different from that of the differential transmission line of the first embodiment.

Figure 17A:
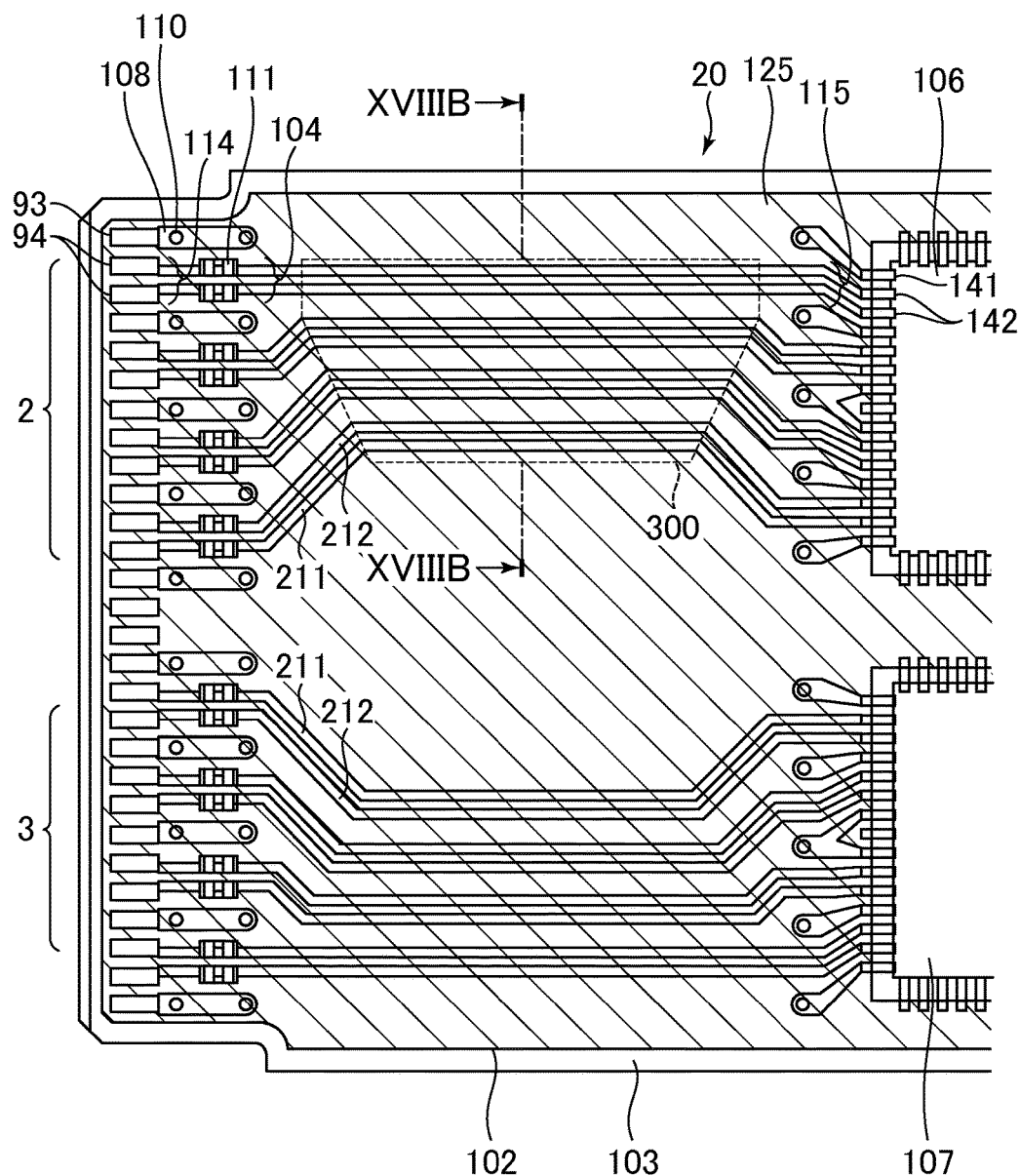
FIG. 17A is a top view of a printed circuit board according to a second embodiment of the present invention.
Figure 17B:
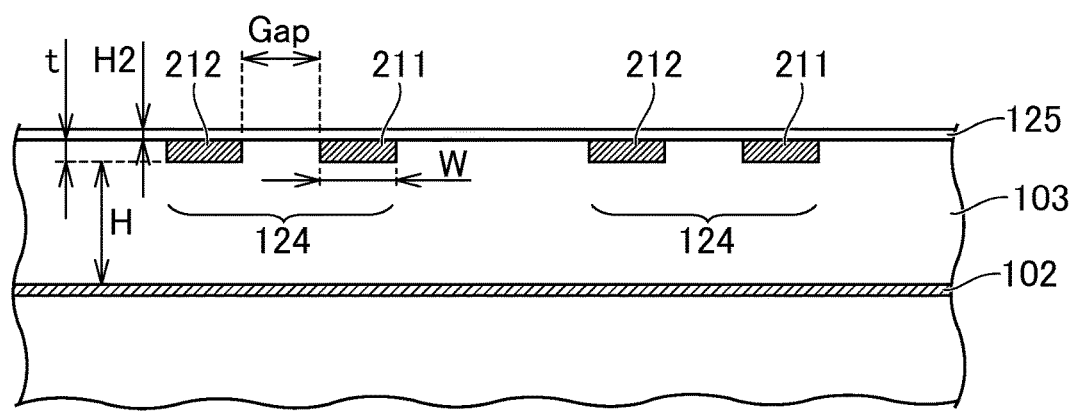
FIG. 17B is a sectional view of the printed circuit board according to the second embodiment of the present invention.

FIG. 17A is a top view of the printed circuit board 20 according to this embodiment. FIG. 17B is a sectional view of the printed circuit board 20 according to this embodiment, which illustrates a part of a cross section taken along the line XVIIIB-XVIIIB of FIG. 17A. This embodiment is the same as the first embodiment except for the point that the structure of the uppermost layer of the printed circuit board 20 is different. Therefore, structures similar to those in the first embodiment are denoted by like reference symbols, and redundant description thereof is omitted.

As illustrated in FIG. 17B, the differential transmission line of this embodiment includes the ground conductor layer 102, the strip conductor pair 124 (right strip conductor 211 and left strip conductor 212) positioned above the ground conductor layer 102, the dielectric layer 103 for embedding the strip conductor pair 124 from an upper side of the ground conductor layer 102, the dielectric layer 103 having an upper surface that is flush with the upper surface of the strip conductor pair 124, and a solder resist layer 125 formed by being applied on the upper surface of the strip conductor pair 124 and on the dielectric layer 103. Further, the interface between the upper surface of the solder resist layer 125 and the outer gas is formed flat. Note that, the solder resist layer 125 is formed of a dielectric, and the dielectric layer 103 and the solder resist layer 125 are together referred to as the dielectric layer for embedding the strip conductor pair 124.

The dimensions of the respective portions of the differential transmission line in this embodiment are set as follows. The distance H is 0.279 mm, the strip conductor thickness t is 53 μm, and the distance H2 is 50 μm (in this embodiment, the distance H2 is the thickness of the solder resist layer 125). In other words, the thickness of the dielectric layer (dielectric layer 103 and solder resist layer 125) arranged between the ground conductor layer 102 and the outer gas in a region between the channels is 0.382 mm (distance H+strip conductor thickness t+distance H2). Further, the strip conductor gap Gap is set to 0.20 mm, and the strip conductor width W is set so that the characteristic impedance Zdiff of the differential transmission line becomes a desired value. In this case, when W is 0.2 mm, the characteristic impedance Zdiff is a value close to 100Ω. The channel pitch Pa is determined in accordance with the distance H, and is 1.1 mm in this case.

Figure 18:
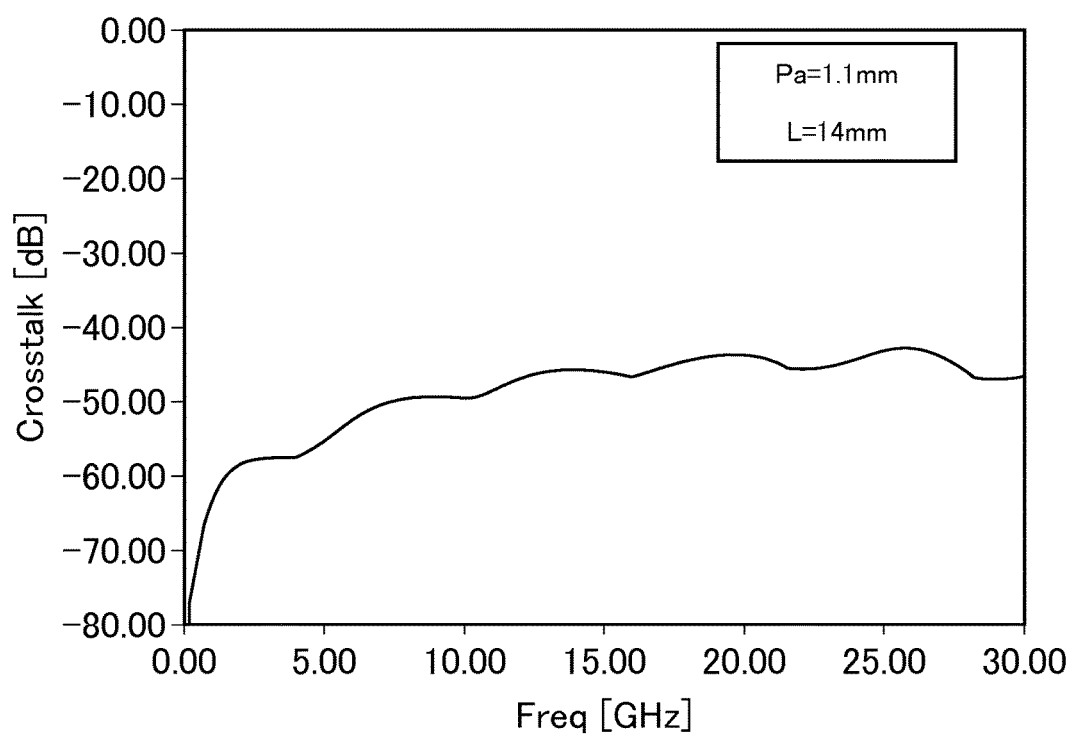
FIG. 18 is a graph showing crosstalk characteristics between the channels of a differential transmission line according to the second embodiment of the present invention.

FIG. 18 is a graph showing the crosstalk characteristics between the channels in the differential transmission line according to this embodiment. In this case, the crosstalk characteristics are calculated assuming that the channel length L is 14 mm and the permitted value of the crosstalk amount is −35 dB. As shown in FIG. 18, in the frequency range from 0 Hz to 30 GHz, the crosstalk amount is −42 dB or less. Thus, the crosstalk amount between the differential transmission lines can be reduced.

As described above, the differential transmission line according to this embodiment can be attained by a structure of a printed circuit board whose number of wiring layers is relatively small as compared to the differential transmission line according to the first embodiment, and thus produces a remarkable effect.

Figure 19A:
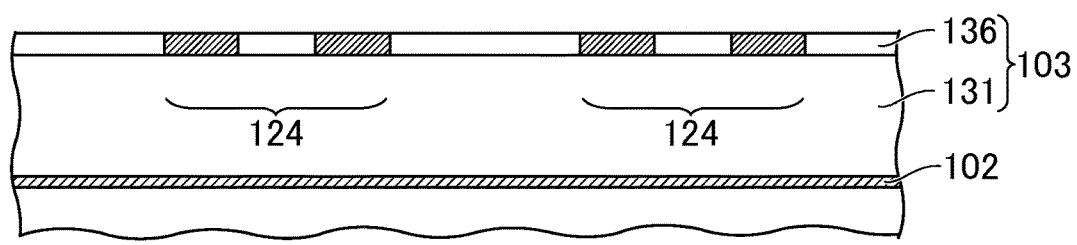
FIG. 19A is a view schematically illustrating a process of a method of manufacturing a differential transmission line according to the second embodiment of the present invention.
Figure 19B:
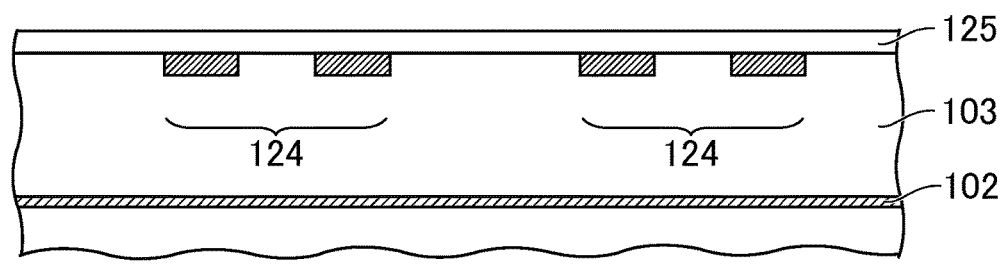
FIG. 19B is a view schematically illustrating the process of the method of manufacturing a differential transmission line according to the second embodiment of the present invention.

Now, with reference to FIGS. 19A and 19B, the method of manufacturing the differential transmission line according to this embodiment is described. FIGS. 19A and 19B are views schematically illustrating the process of the method of manufacturing the differential transmission line according to this embodiment. Note that, the manufacturing method according to this embodiment is similar to the method of manufacturing the differential transmission line according to the first embodiment until the second dielectric layer forming step illustrated in FIG. 16C. Therefore, redundant description is omitted herein.

Next, the copper foil 134 in the uppermost layer is removed by surface polishing (metal foil removing step). Then, the second dielectric layer 133 is further subjected to surface polishing, to thereby form a third dielectric layer 136 having an upper surface that is flush with the upper surface of the strip conductor pair 124 (third dielectric layer forming step: FIG. 19A). That is, the second dielectric layer 133 is subjected to surface polishing so that the polishing reaches the upper portion of the strip conductor pair 124, and the upper portion of the strip conductor pair 124 is polished. In this manner, the upper surface of the strip conductor pair 124 and the upper surface of the second dielectric layer 133 are formed flush with each other. The second dielectric layer 133 polished to this state is the third dielectric layer 136. Then, as illustrated in FIG. 19B, a solder resist is applied in a film form onto the dielectric layer 103 and the strip conductor pair 104, to thereby form the solder resist layer 125 (solder resist layer forming step). Note that, the dielectric layer 103 illustrated in FIG. 19B includes the first dielectric layer 131 and the third dielectric layer 136 illustrated in FIG. 19A. It is effective to use thermosetting epoxy resin ink as the material of the solder resist layer 125. The part of the solder resist layer 125 on the terminal area, which requires solder connection, is removed by etching, and then the remaining part is cured. With this, the solder resist layer 125 is formed on the upper surface of the strip conductor pair 124 and the upper surface of the second dielectric layer 133 that are flush with each other. Thus, the interface between the upper surface of the solder resist layer 125 and the outer gas can be formed flat.

In the differential transmission line according to the present invention, the upper surface (interface with the outer gas) of the dielectric layer for embedding the plurality of first strip conductor pairs (strip conductor pairs 124) is formed flat. Flat herein refers to a state obtained through a step of planarizing the upper surface of the dielectric layer as described in the first embodiment or the second embodiment. In other words, unlike the differential transmission line 5 according to the second prior art illustrated in FIG. 10, the present invention does not include a case where the solder resist layer 205 is formed without carrying out the planarizing step. Note that, it is needless to say that the first embodiment and the second embodiment are examples of the step of planarizing the upper surface of the dielectric layer, and the present invention is not limited to those examples. A dielectric layer having a flat upper surface by being subjected to a planarizing step can be widely employed.

Third Embodiment

Figure 20:
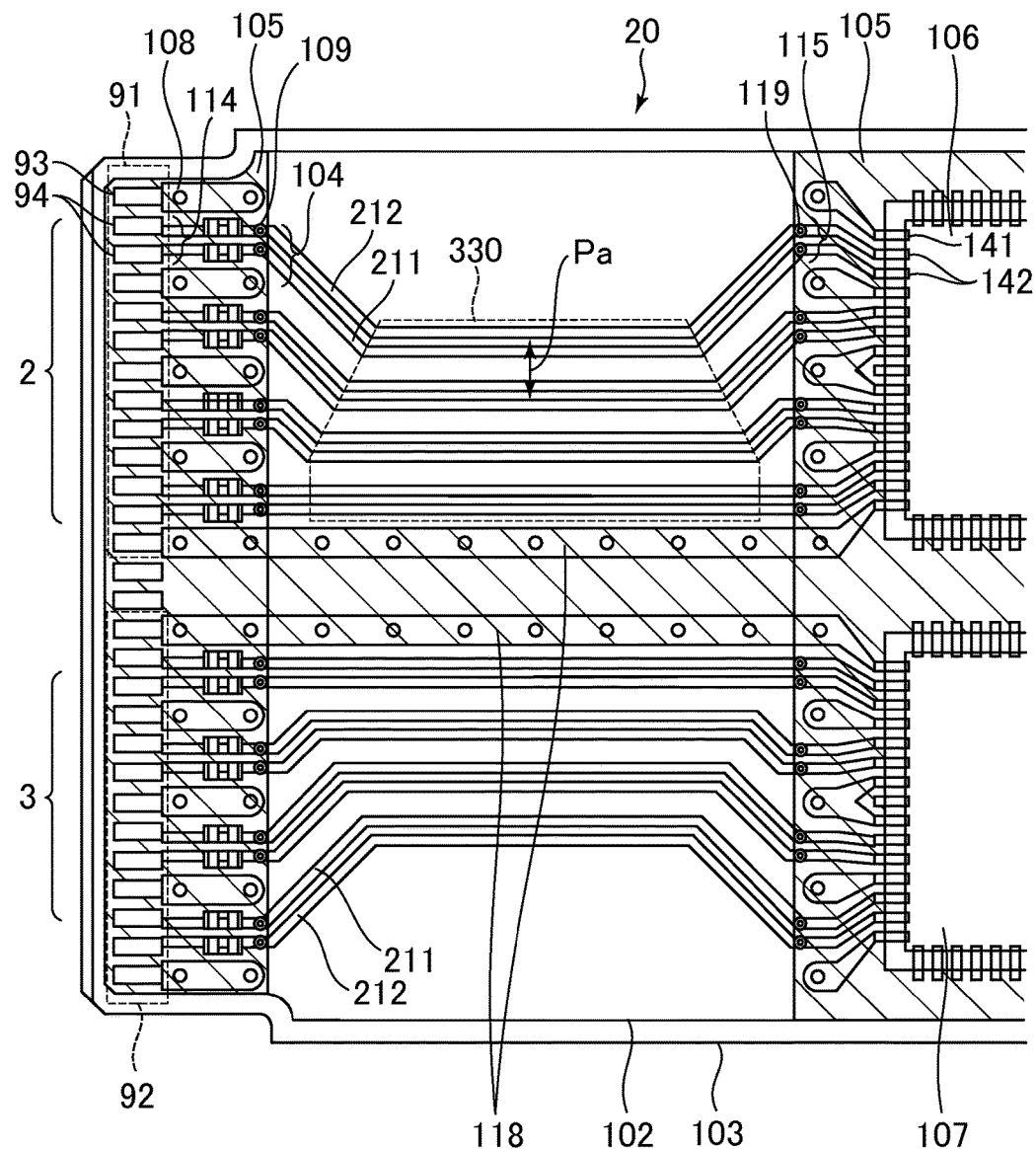
FIG. 20 is a top view of a printed circuit board according to a third embodiment of the present invention.

FIG. 20 is a top view of the printed circuit board 20 according to a third embodiment of the present invention. As compared to the printed circuit board 20 according to the first embodiment, the printed circuit board 20 according to this embodiment differs in the wiring layout and in that metal wiring 118 is arranged between the receiver-side differential transmission line 2 and the transmitter-side differential transmission line 3. However, other points are the same as those in the first embodiment. As illustrated in FIG. 20, the inner strip conductor pair, which is arranged at the innermost side in the strip conductor pairs 104 included in the receiver-side differential transmission line 2, is extended linearly from the via hole 109 to the via hole 119. Further, the transmitter-side differential transmission line 3 can also have a structure similar to the above-mentioned structure of the receiver-side differential transmission line 2. With this, the crosstalk amount between the differential transmission lines can be reduced, and a region where no differential transmission line is arranged can be secured on the outer side of the printed circuit board 20.

However, the plurality of strip conductor pairs included in each of the receiver-side differential transmission line 2 and the transmitter-side differential transmission line 3 are all gathered at the inner side of the printed circuit board 20. Therefore, the problem of backward crosstalk from the transmitter-side differential transmission line 3 to the receiver-side differential transmission line 2 (or in the opposite direction) arises between the inner strip conductor pair of the receiver-side differential transmission line 2 and the inner strip conductor pair of the transmitter-side differential transmission line 3. In the printed circuit board 20 according to this embodiment, however, the metal wiring 118 is arranged between the plurality of strip conductor pairs 104 included in the receiver-side differential transmission line 2 and the plurality of strip conductor pairs 104 included in the transmitter-side differential transmission line 3 and in the same layer as those plurality of strip conductor pairs 104. The metal wiring 118 is electrically connected to the ground conductor layer 102. In this manner, the metal wiring 118 serves as a guard trace between the transmitter-side strip conductor pair 104 and the receiver-side strip conductor pair 104, and thus the backward crosstalk from the transmitter-side differential transmission line 3 to the receiver-side differential transmission line 2 can be reduced. Note that, the description "between the plurality of strip conductor pairs 104 included in the receiver-side differential transmission line 2 and the plurality of strip conductor pairs 104 included in the transmitter-side differential transmission line 3" refers to a region between an end at one side (lower side in FIG. 20) of the plurality of strip conductor pairs 104 included in the receiver-side differential transmission line 2 and an end at another side (upper side in FIG. 20) of the plurality of strip conductor pairs 104 included in the transmitter-side differential transmission line 3, and may be also referred to as a region between an edge line at the one side (lower side in FIG. 20) of the right strip conductor 211 of the inner strip conductor pair of the receiver-side differential transmission line 2 and an edge line at the another side (upper side in FIG. 20) of the right strip conductor 211 of the inner strip conductor pair of the transmitter-side differential transmission line 3.

Further, in a straight line region 330 of the printed circuit board 20 according to this embodiment, the centers of the plurality of strip conductor pairs 124 (first strip conductor pairs) included in the receiver-side differential transmission line 2 are arranged at the one side (lower side in FIG. 20) with respect to the center of the receiver-side terminal row 91, and are arranged at the another side (upper side in FIG. 20) of the metal wiring 118. Similarly, the centers of the plurality of strip conductor pairs 124 (second strip conductor pairs) included in the transmitter-side differential transmission line 3 are arranged at the another side (upper side in FIG. 20) with respect to the center of the transmitter-side terminal row 92, and are arranged at the one side (lower side in FIG. 20) of the metal wiring 118.

Fourth Embodiment

Figure 21:
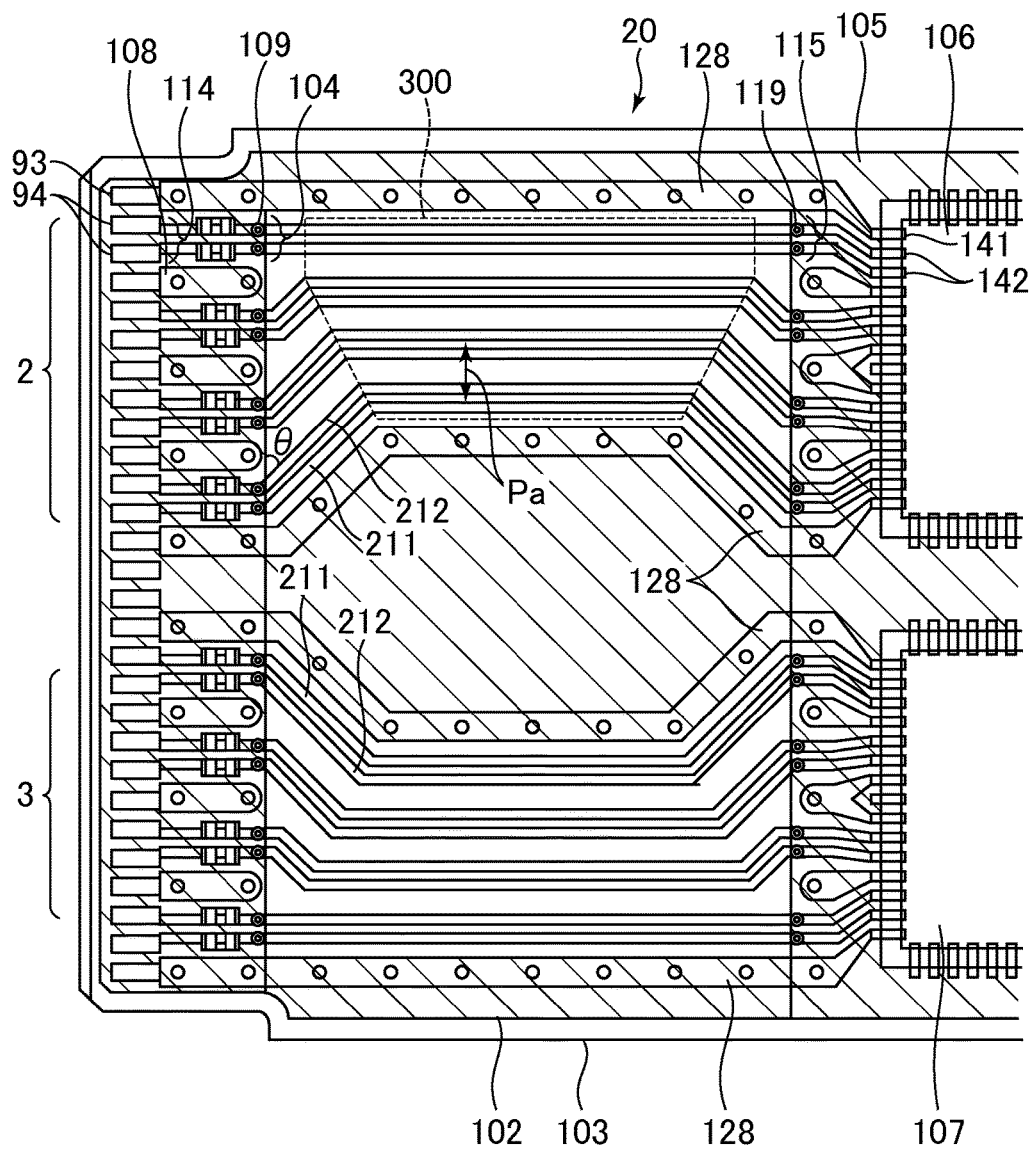
FIG. 21 is a top view of a printed circuit board according to a fourth embodiment of the present invention.

FIG. 21 is a top view of the printed circuit board 20 according to a fourth embodiment of the present invention. In contrast to the printed circuit board 20 according to the first embodiment, the printed circuit board 20 according to this embodiment has metal wiring 128 arranged thereon. However, other points are similar to those in the first embodiment. As illustrated in FIG. 21, the metal wiring 128 is arranged at both sides of the receiver-side differential transmission line 2 and at both sides of the transmitter-side differential transmission line 3. That is, the metal wiring 128 is arranged at the further outer side of the outer strip conductor pair arranged at the outermost side in the receiver-side differential transmission line 2 so as to be parallel to the outer strip conductor pair, and is arranged at the further inner side of the inner strip conductor pair arranged at the innermost side in the receiver-side differential transmission line 2 so as to be parallel to the inner strip conductor pair. Further, the transmitter-side differential transmission line 3 can have a structure similar to the above-mentioned structure of the receiver-side differential transmission line 2. With this, the metal wiring 128 serves as a guard trace between the transmitter-side strip conductor pair 104 and the receiver-side strip conductor pair 104, and thus the backward crosstalk from the transmitter-side differential transmission line 3 to the receiver-side differential transmission line 2 can be further reduced.

Fifth Embodiment

In the first to fourth embodiments, the terminal row 101 is connected to the connector 10, but the terminal row 101 may be connected to flexible printed circuits (FPCs). In view of this, in a fifth embodiment of the present invention, the optical module is shaped based on the QSFP28 MSA standard. QSFP28 is one type of the MSA standard of the optical transceiver with 100 Gbit/s. QSFP28 is smaller than CFP4, but transmits a digital signal in a bit rate similar to that of CFP4.

Figure 22:
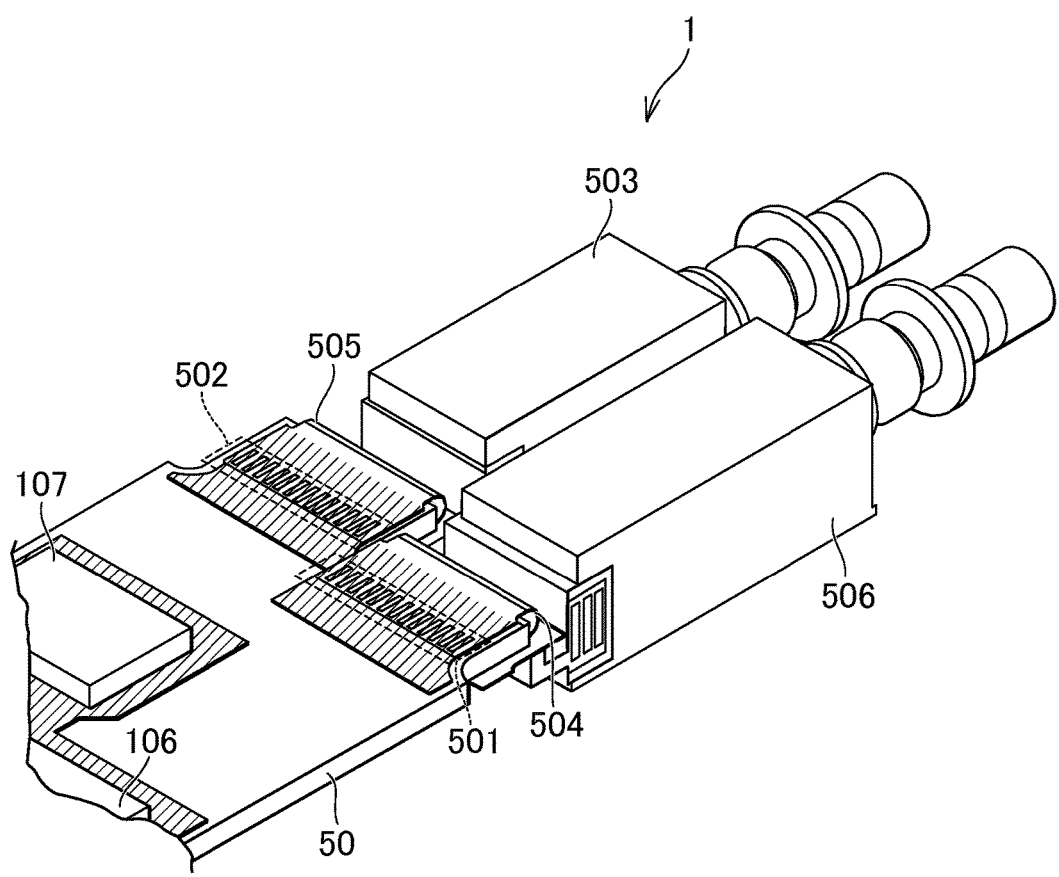
FIG. 22 is a schematic view of an optical module according to a fifth embodiment of the present invention.

FIG. 22 is a schematic view of the optical module according to this embodiment, and the optical module 1 according to this embodiment is based on the QSFP28 MSA standard. As illustrated in FIG. 22, the optical module 1 according to the fifth embodiment includes a printed circuit board 50, a ROSA 506, a TOSA 503, a first FPC 504, and a second FPC 505.

The printed circuit board 50 includes a first terminal row 501, a second terminal row 502, the receiving integrated circuit 106, and the transmitting integrated circuit 107. The first terminal row 501 is connected to the first FPC 504 that is a flexible printed board for connection to the ROSA 506, and the second terminal row 502 is connected to the second FPC 505 that is a flexible printed board for connection to the TOSA 503.

Figure 23:
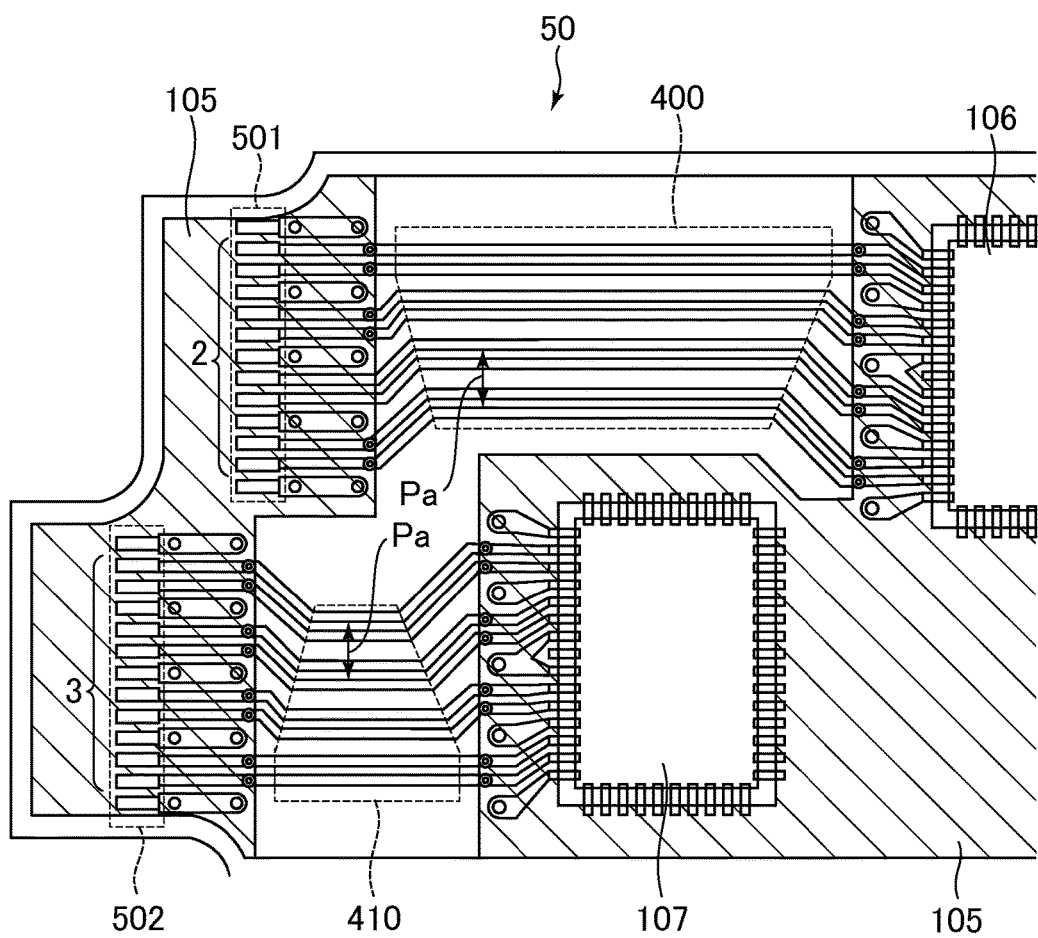
FIG. 23 is a top view of a printed circuit board according to the fifth embodiment of the present invention.

FIG. 23 is a top view of the printed circuit board 50 according to this embodiment. As illustrated in FIG. 23, the four-channel receiver-side differential transmission line 2 at the receiver side is connected between the first terminal row 501 and the receiving integrated circuit 106, and the four-channel transmitter-side differential transmission line 3 at the transmitter side is connected between the second terminal row 502 and the transmitting integrated circuit 107. The receiver-side differential transmission line 2 includes four differential transmission lines adjacent to each other, and is configured to transmit a signal in a direction from the first terminal row 501 to the input terminal row of the receiving integrated circuit 106. Further, the transmitter-side differential transmission line 3 includes four differential transmission lines adjacent to each other, and is configured to transmit a signal in a direction from the output terminal row of the transmitting integrated circuit 107 to the second terminal row 502.

In the optical module based on the QSFP28 MSA standard according to this embodiment, the width of the printed circuit board 50 is defined to 16 to 17 mm. The printed circuit board 50 based on the QSFP28 MSA standard is reduced in size by about 10% from the printed circuit board based on the CFP4 MSA standard. In this embodiment, as illustrated in FIG. 22, the channel pitch Pa is narrowed (for example, Pa=0.5 mm) in a straight line region 400 in the receiver-side differential transmission line 2, and the transmitting integrated circuit 107 is arranged adjacent thereto. Similarly, the channel pitch Pa may be narrowed in a straight line region 410 in the transmitter-side differential transmission line 3. With this, the crosstalk amount can be reduced between the channels of the receiver-side differential transmission line 2, between the channels of the transmitter-side differential transmission line 3, and between the channel of the transmitter-side differential transmission line 3 and the channel of the receiver-side differential transmission line 2. In addition, the region occupied by the differential transmission line can be narrowed in the printed circuit board 50.

As described above, even in the case of the printed circuit board connected to an optical module such as the TOSA and the ROSA through intermediation of the flexible printed board, by using the differential transmission line in which the dielectric layer embedding the strip conductor pair is arranged on the upper surface of the ground conductor layer, and in which the interface between the dielectric layer and the outer gas is formed flat, the channel pitch Pa of the plurality of differential transmission lines is reduced. In this manner, it is possible to provide an optical module capable of increasing the speed and packaging density.

Note that, the present invention is not limited to the above-mentioned embodiments. For example, in the above-mentioned embodiments, the crosstalk characteristics are verified in the straight line region 300 of the printed circuit board 20, but the region to be verified is not limited to this region. The crosstalk characteristics may be verified in a region including a portion bent by 45° in the strip conductor pair 104, which is arranged while maintaining the same channel pitch Pa, and parallel linear portions at front and rear sides of the bent portion. When a signal is input to the differential transmission line including the bent portion as described above, apart of the signal is converted into an in-phase mode due to the difference in the electrical length between the transmission lines. In general, a common-mode signal component often significantly deteriorates the crosstalk amount as compared to a differential-mode signal component. However, this time, in the frequency range of from 0 Hz to 30 GHz, and under conditions of the distance Gap between the strip conductors of 0.25 mm or less and an angle θ of the bent portion of 45° or less, when the structure of the printed circuit board 20 of this embodiment is employed, improvement effects similar to those of the above-mentioned embodiments can be obtained almost without deteriorating the crosstalk amount as compared to the case where the transmission line is a straight line.

Further, the present invention is not limited to the optical module according to the above-mentioned embodiments, and is applicable to another optical module including a differential transmission line and an information processing device such as a computer.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A differential transmission circuit, comprising:
   a ground conductor layer;
   a plurality of first strip conductor pairs arranged side by side along a first direction in a same layer above the ground conductor layer, each of the plurality of first strip conductor pairs comprising a first right strip conductor and a first left strip conductor;
   a dielectric layer for embedding the plurality of first strip conductor pairs from an upper side of the ground conductor layer, the dielectric layer being formed up to a region above the plurality of first strip conductor pairs, the dielectric layer having a flat upper surface exposed to an outer gas,
   wherein a region between an adjacent two of the plurality of first strip conductor pairs is embedded in the dielectric layer without arranging a conductor in the region,
   wherein each of the plurality of first strip conductor pairs has a length of 14 mm or less,
   wherein a distance between inner edges of the first right strip conductor and the first left strip conductor in the each of the plurality of first strip conductor pairs is 0.25 mm or less, and
   wherein, when an x coordinate represents a distance from the ground conductor layer to the plurality of first strip conductor pairs and a y coordinate represents a distance between centers of the adjacent two of the plurality of first strip conductor pairs, the distance from the ground conductor layer to the plurality of first strip conductor pairs and the distance between the centers of the adjacent two of the plurality of first strip conductor pairs represent a combination positioned one of on and inside a range of a quadrilateral having vertices of (0.1 mm, 1.0 mm), (0.1 mm, 0.8 mm), (0.5 mm, 1.4 mm), and (0.5 mm, 2.1 mm).

2. An optical module, comprising the differential transmission circuit according to claim 1.

3. The optical module according to claim 2, further comprising:
   a plurality of first signal terminal pairs and a plurality of first ground terminals repeatedly arranged side by side along the first direction in a terminal layer above the ground conductor layer at one end of the plurality of first strip conductor pairs,
   wherein each of the plurality of first signal terminal pairs is electrically connected to corresponding one of the plurality of first strip conductor pairs,
   wherein each of the plurality of first ground terminals is electrically connected to the ground conductor layer, and
   wherein a distance between centers of the adjacent two of the plurality of first strip conductor pairs is smaller than a distance between centers of corresponding adjacent two of the plurality of first signal terminal pairs.

4. The optical module according to claim 3, further comprising:
   a plurality of second strip conductor pairs arranged along the first direction in the same layer as the plurality of first strip conductor pairs, the plurality of second strip conductor pairs being arranged along the first direction ahead of the plurality of first strip conductor pairs; and
   a plurality of second signal terminal pairs and a plurality of second ground terminals repeatedly arranged side by side along the first direction in the terminal layer, the plurality of second signal terminal pairs and the plurality of second ground terminals being arranged along the first direction ahead of the plurality of first signal terminal pairs and the plurality of first ground terminals,
   wherein each of the plurality of second strip conductor pairs comprises a second right strip conductor and a second left strip conductor,
   wherein a region between adjacent two of the plurality of second strip conductor pairs is embedded in the dielectric layer without arranging a conductor in the region,
   wherein each of the plurality of second signal terminal pairs is electrically connected to corresponding one of the plurality of second strip conductor pairs,
   wherein each of the plurality of second ground terminals is electrically connected to the ground conductor layer,
   wherein a distance between centers of the adjacent two of the plurality of second strip conductor pairs is smaller than a distance between centers of corresponding adjacent two of the plurality of second signal terminal pairs, and
   wherein each of the plurality of first strip conductor pairs and each of the plurality of second strip conductor pairs is used for either transmitting or receiving, respectively, or receiving and transmitting, respectively.

5. The optical module according to claim 4, further comprising:
   metal wiring positioned between the plurality of first strip conductor pairs and the plurality of second strip conductor pairs and arranged in the same layer as the plurality of first strip conductor pairs and the plurality of second strip conductor pairs, the metal wiring being electrically connected to the ground conductor layer.

6. The differential transmission circuit according to claim 1, wherein the dielectric layer is made of a glass epoxy resin.

7. The differential transmission circuit according to claim 6,
   wherein the dielectric layer includes:
   a first dielectric layer disposed between the ground conductor layer and bottom surfaces of the plurality of strip conductor pairs; and
   a second dielectric layer disposed between the bottom surfaces of the plurality of strip conductor pairs and the flat upper surface, formed by (i) bonding a prepreg dielectric formed on the first dielectric layer and metal foil on upper and lower surfaces of a differential transmission line basic structure, (ii) heating in a pressurized state with use of a planar heating platen, and (iii) removing the metal foil.

8. The differential transmission circuit according to claim 1, wherein the dielectric layer is made of a glass epoxy resin from the ground conductor layer up to upper surfaces of the plurality of first strip conductor pairs, and is made of a solder resist from the upper surfaces of the plurality of first strip conductor pairs to an interface with the outer gas.

9. The differential transmission circuit according to claim 8,
wherein the dielectric layer includes:
  a first dielectric layer disposed between the ground conductor layer and bottom surfaces of the plurality of strip conductor pairs;
  a second dielectric layer disposed between the bottom surfaces and upper surfaces of the plurality of strip conductor pairs, formed by (i) bonding a prepreg dielectric formed on the first dielectric layer and metal foil on upper and lower surfaces of a differential transmission line basic structure, (ii) heating in a pressurized state with use of a planar heating platen, (iii) removing the metal foil, and (iv) polishing the second dielectric layer and the plurality of strip conductor pairs so as to have a common flattened surface; and
  a solder resist layer by applying a solder resist on the second dielectric layer and the plurality of strip conductor pairs.

10. The differential transmission circuit according to claim 1, wherein the plurality of first strip conductor pairs have the same signal transmission direction.

11. An optical module including a differential transmission circuit comprising:
a ground conductor layer;
a plurality of first strip conductor pairs arranged side by side along a first direction in a same layer above the ground conductor layer, each of the plurality of first strip conductor pairs comprising a first right strip conductor and a first left strip conductor;
a dielectric layer for embedding the plurality of first strip conductor pairs from an upper side of the ground conductor layer, the dielectric layer being formed up to a region above the plurality of first strip conductor pairs, the dielectric layer having a flat upper surface exposed to an outer gas;
a plurality of first signal terminal pairs and a plurality of first ground terminals repeatedly arranged side by side along the first direction in a terminal layer above the ground conductor layer at one end of the plurality of first strip conductor pairs;
a plurality of second strip conductor pairs arranged along the first direction in the same layer as the plurality of first strip conductor pairs, the plurality of second strip conductor pairs being arranged along the first direction ahead of the plurality of first strip conductor pairs; and
a plurality of second signal terminal pairs and a plurality of second ground terminals repeatedly arranged side by side along the first direction in the terminal layer, the plurality of second signal terminal pairs and the plurality of second ground terminals being arranged along the first direction ahead of the plurality of first signal terminal pairs and the plurality of first ground terminals,
wherein a region between an adjacent two of the plurality of first strip conductor pairs is embedded in the dielectric layer without arranging a conductor in the region,
wherein each of the plurality of first signal terminal pairs is electrically connected to corresponding one of the plurality of first strip conductor pairs,
wherein each of the plurality of first ground terminals is electrically connected to the ground conductor layer,
wherein a distance between centers of the adjacent two of the plurality of first strip conductor pairs is smaller than a distance between centers of corresponding adjacent two of the plurality of first signal terminal pairs,
wherein each of the plurality of second strip conductor pairs comprises a second right strip conductor and a second left strip conductor,
wherein a region between adjacent two of the plurality of second strip conductor pairs is embedded in the dielectric layer without arranging a conductor in the region,
wherein each of the plurality of second signal terminal pairs is electrically connected to corresponding one of the plurality of second strip conductor pairs,
wherein each of the plurality of second ground terminals is electrically connected to the ground conductor layer,
wherein a distance between centers of the adjacent two of the plurality of second strip conductor pairs is smaller than a distance between centers of corresponding adjacent two of the plurality of second signal terminal pairs,
wherein each of the plurality of first strip conductor pairs and each of the plurality of second strip conductor pairs is used for either transmitting or receiving, respectively, or receiving and transmitting, respectively,
wherein the centers of the plurality of second strip conductor pairs are located along the first direction ahead of the centers of the plurality of second signal terminal pairs, and
wherein the centers of the plurality of first strip conductor pairs are located along the first direction posterior to the centers of the plurality of first signal terminal pairs.

12. An optical module including a differential transmission circuit comprising:
a ground conductor layer;
a plurality of first strip conductor pairs arranged side by side along a first direction in a same layer above the ground conductor layer, each of the plurality of first strip conductor pairs comprising a first right strip conductor and a first left strip conductor;
a dielectric layer for embedding the plurality of first strip conductor pairs from an upper side of the ground conductor layer, the dielectric layer being formed up to a region above the plurality of first strip conductor pairs, the dielectric layer having a flat upper surface exposed to an outer gas;
a plurality of first signal terminal pairs and a plurality of first ground terminals repeatedly arranged side by side along the first direction in a terminal layer above the ground conductor layer at one end of the plurality of first strip conductor pairs;
a plurality of second strip conductor pairs arranged along the first direction in the same layer as the plurality of first strip conductor pairs, the plurality of second strip conductor pairs being arranged along the first direction ahead of the plurality of first strip conductor pairs;
a plurality of second signal terminal pairs and a plurality of second ground terminals repeatedly arranged side by side along the first direction in the terminal layer, the plurality of second signal terminal pairs and the plurality of second ground terminals being arranged along the first direction ahead of the plurality of first signal terminal pairs and the plurality of first ground terminals; and metal wiring positioned between the plurality of first strip conductor pairs and the plurality of second strip conductor pairs and arranged in the same layer as the plurality of first strip conductor pairs and the plurality of second strip conductor pairs, the metal wiring being electrically connected to the ground conductor layer, wherein a region between an adjacent two of the plurality of first strip conductor pairs is embedded in the dielectric layer without arranging a conductor in the region, wherein each of the plurality of first signal terminal pairs is electrically connected to corresponding one of the plurality of first strip conductor pairs, wherein each of the plurality of first ground terminals is electrically connected to the ground conductor layer, wherein a distance between centers of the adjacent two of the plurality of first strip conductor pairs is smaller than a distance between centers of corresponding adjacent two of the plurality of first signal terminal pairs, wherein each of the plurality of second strip conductor pairs comprises a second right strip conductor and a second left strip conductor, wherein a region between adjacent two of the plurality of second strip conductor pairs is embedded in the dielectric layer without arranging a conductor in the region, wherein each of the plurality of second signal terminal pairs is electrically connected to corresponding one of the plurality of second strip conductor pairs, wherein each of the plurality of second ground terminals is electrically connected to the ground conductor layer, wherein a distance between centers of the adjacent two of the plurality of second strip conductor pairs is smaller than a distance between centers of corresponding adjacent two of the plurality of second signal terminal pairs, wherein each of the plurality of first strip conductor pairs and each of the plurality of second strip conductor pairs is used for either transmitting or receiving, respectively, or receiving and transmitting, respectively, wherein the centers of the plurality of first strip conductor pairs are located along the first direction ahead of the centers of the plurality of first signal terminal pairs, and are located along the first direction posterior to the metal wiring, and wherein the centers of the plurality of second strip conductor pairs are located along the first direction posterior to the centers of the plurality of second signal terminal pairs, and are located along the first direction ahead of the metal wiring.

* * * * *